(12) United States Patent
Chiang et al.

(10) Patent No.: US 11,348,884 B1
(45) Date of Patent: May 31, 2022

(54) ORGANIC INTERPOSER INCLUDING A DUAL-LAYER INDUCTOR STRUCTURE AND METHODS OF FORMING THE SAME

(71) Applicant: Taiwan Semiconductor Manufacturing Company Limited, Hsinchu (TW)

(72) Inventors: Wei-Han Chiang, Hsinchu (TW); Ming-Da Cheng, Taoyuan (TW); Ching-Ho Cheng, Hsinchu (TW); Wei Sen Chang, Jinsha Township (TW); Hong-Seng Shue, Zhubei (TW); Ching-Wen Hsiao, Hsinchu (TW); Chun-Hung Chen, Xinpu Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/097,165

(22) Filed: Nov. 13, 2020

(51) Int. Cl.
*H01L 23/64* (2006.01)
*H01L 49/02* (2006.01)
(Continued)

(52) U.S. Cl.
CPC ........ H01L 23/645 (2013.01); H01L 21/4857 (2013.01); H01L 21/6835 (2013.01);
(Continued)

(58) Field of Classification Search
CPC ..... H01L 23/645; H01L 23/145; H01L 24/16; H01L 23/5383; H01L 28/10;
(Continued)

(56) References Cited

U.S. PATENT DOCUMENTS

| 7,531,407 B2 * | 5/2009 | Clevenger ......... H01L 21/76898 257/E21.022 |
| 8,921,976 B2 * | 12/2014 | Zhang .................. H01L 23/645 257/531 |

(Continued)

FOREIGN PATENT DOCUMENTS

| CN | 110335857 A | 10/2019 |
| TW | 201729382 A | 8/2017 |
| WO | 2017222822 A1 | 12/2017 |

OTHER PUBLICATIONS

German Office Action: Application No. 10-2021 100 011.4, Office Action dated May 17, 2021.
(Continued)

*Primary Examiner* — Vu A Vu
(74) *Attorney, Agent, or Firm* — The Marbury Law Group, PLLC

(57) ABSTRACT

An organic interposer includes interconnect-level dielectric material layers embedding redistribution interconnect structures, at least one dielectric capping layer overlying a topmost interconnect-level dielectric material layer, a bonding-level dielectric layer overlying the at least one dielectric capping layer, and a dual-layer inductor structure, which may include a lower conductive coil embedded within the topmost interconnect-level dielectric material layer, a conductive via structure vertically extending through the at least one dielectric capping layer, and an upper conductive coil embedded within the bonding-level dielectric layer and comprising copper.

20 Claims, 20 Drawing Sheets

(51) Int. Cl.
*H01L 23/14* (2006.01)
*H01L 23/538* (2006.01)
*H01L 21/683* (2006.01)
*H01L 21/48* (2006.01)
*H01L 23/00* (2006.01)

(52) U.S. Cl.
CPC ........ *H01L 23/145* (2013.01); *H01L 23/5383* (2013.01); *H01L 23/5386* (2013.01); *H01L 24/16* (2013.01); *H01L 28/10* (2013.01); *H01L 2221/6835* (2013.01); *H01L 2224/16227* (2013.01); *H01L 2924/19042* (2013.01); *H01L 2924/19103* (2013.01)

(58) Field of Classification Search
CPC ............. H01L 23/5386; H01L 21/4857; H01L 21/6835; H01L 2924/19042; H01L 2924/19103; H01L 2221/6835; H01L 2224/16227

USPC ........................................................ 257/531
See application file for complete search history.

(56) References Cited

U.S. PATENT DOCUMENTS

| 2018/0310408 | A1 | 10/2018 | Hamada et al. |
| 2020/0219861 | A1* | 7/2020 | Kamgaing ........ H01L 23/49827 |
| 2020/0321277 | A1 | 10/2020 | Yen et al. |

OTHER PUBLICATIONS

Taiwan Patent and Trademark Office, Application No. 110134153 Office Action dated Dec. 27, 2021, 3 pages.

* cited by examiner

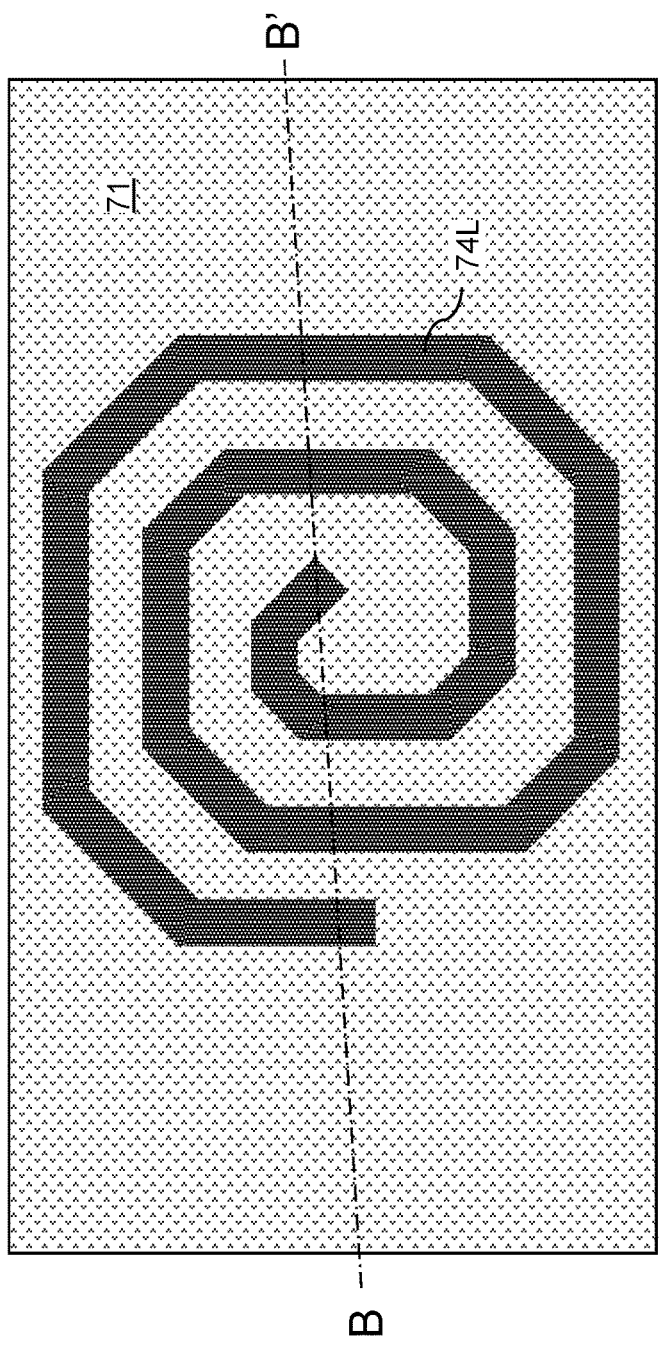
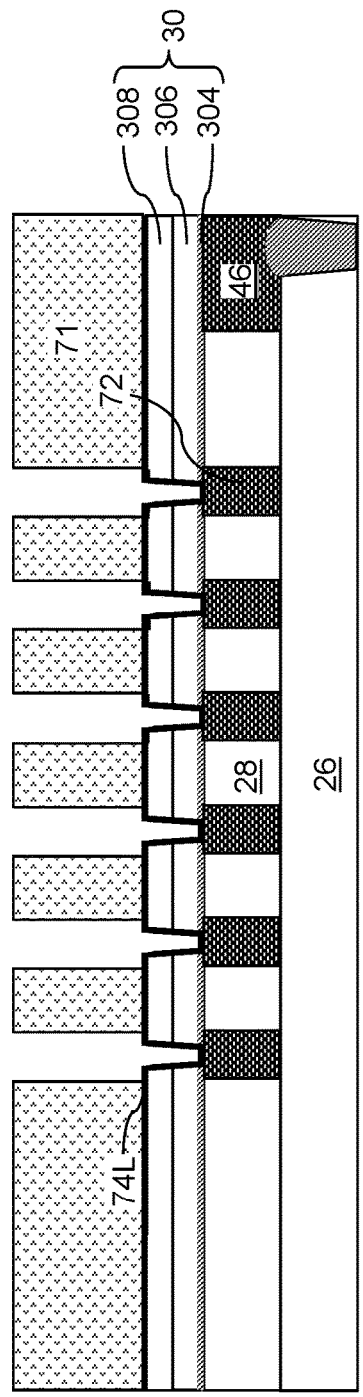
FIG. 5A
FIG. 5B

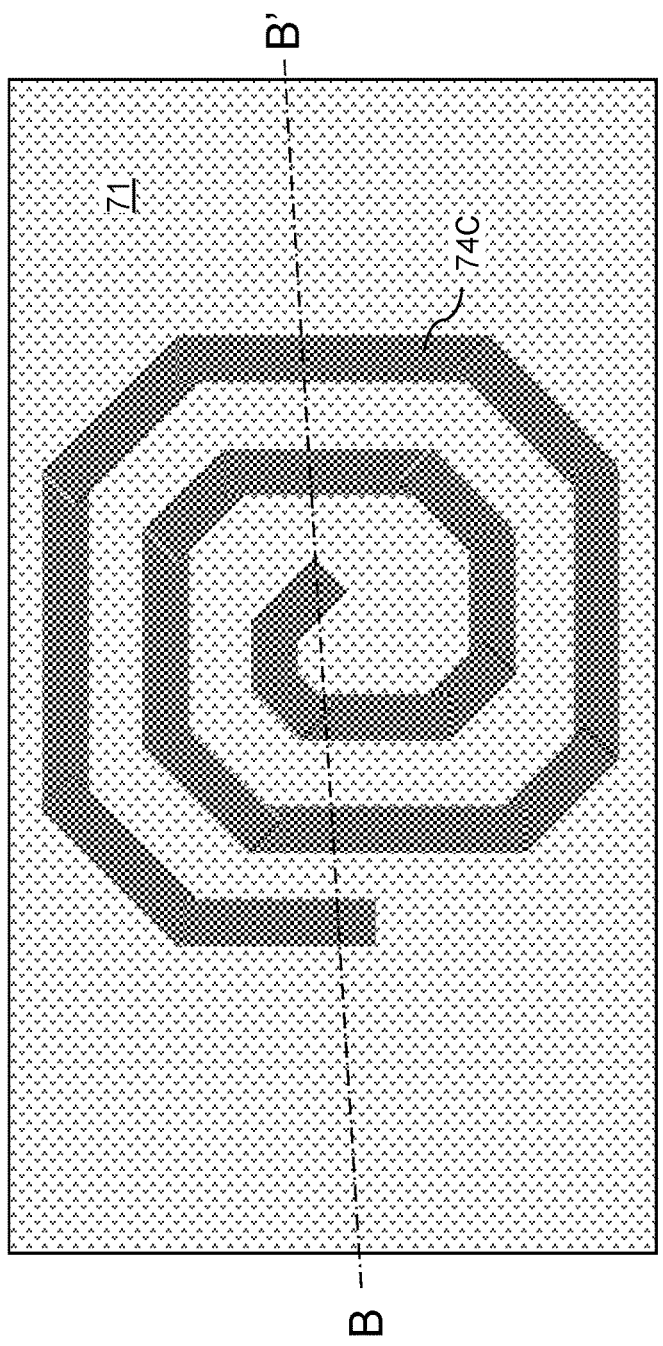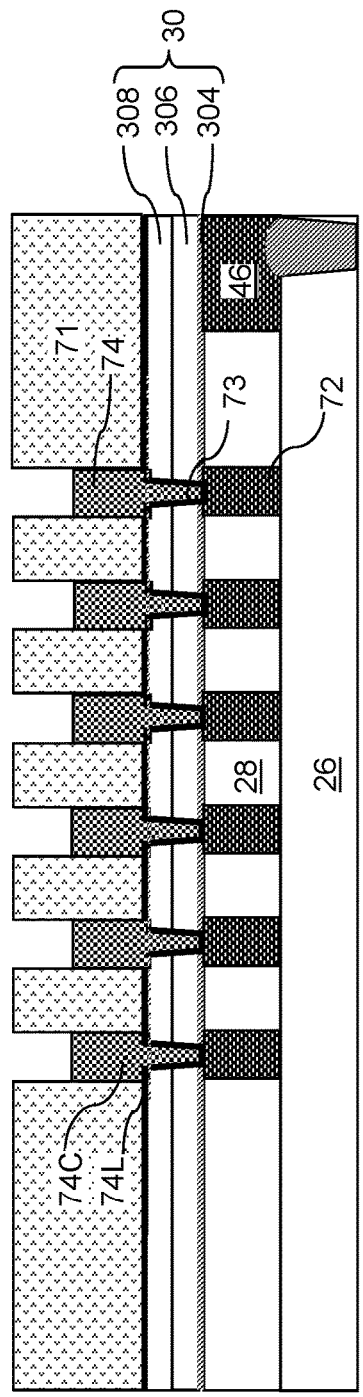
FIG. 6A
FIG. 6B

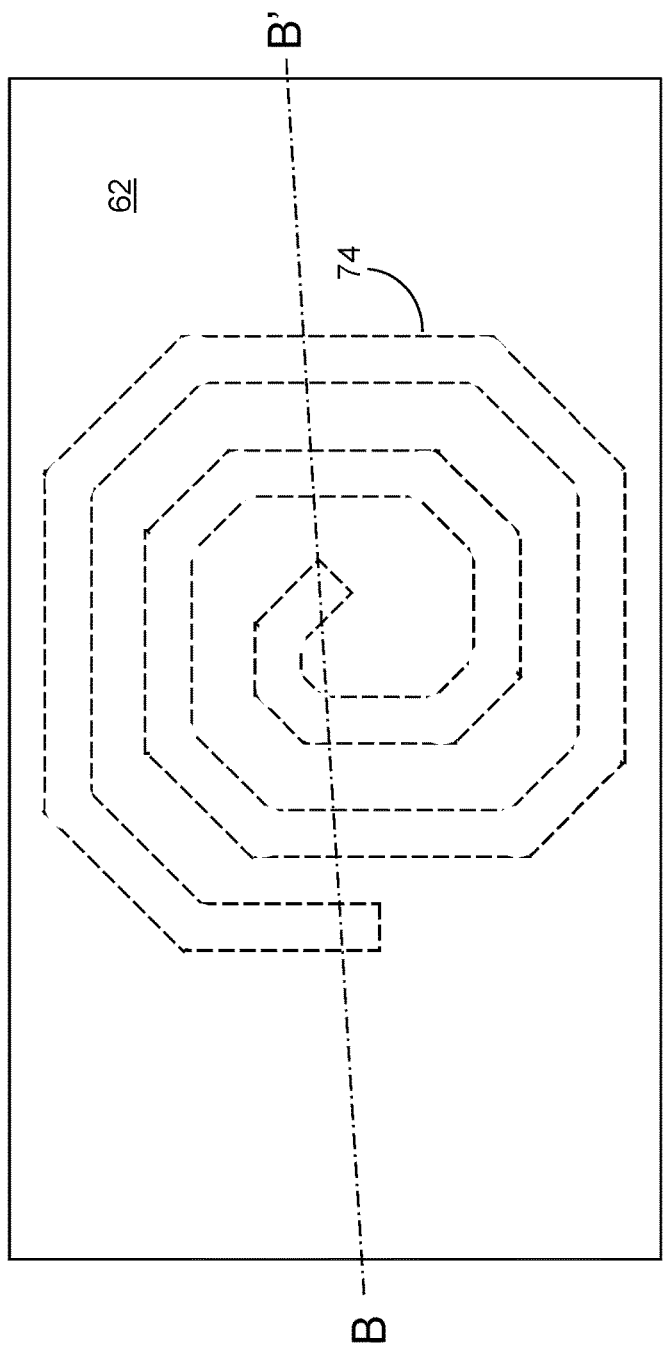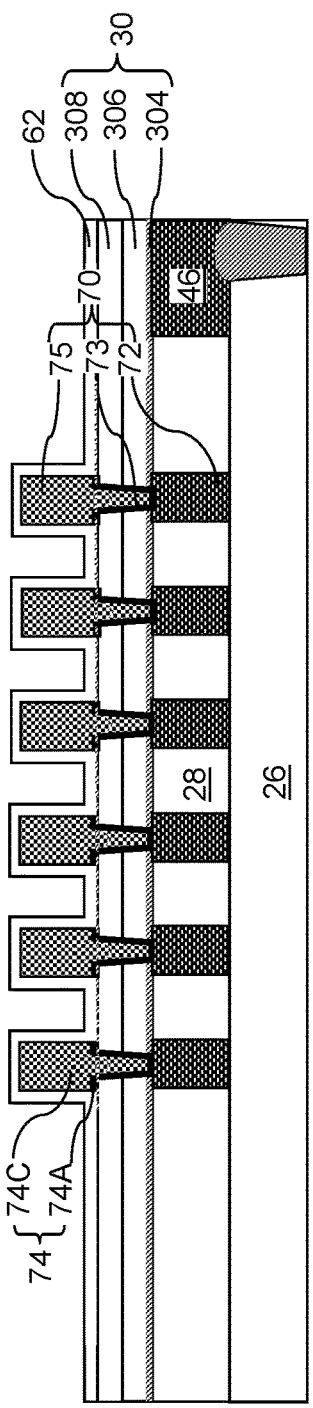
FIG. 9A
FIG. 9B

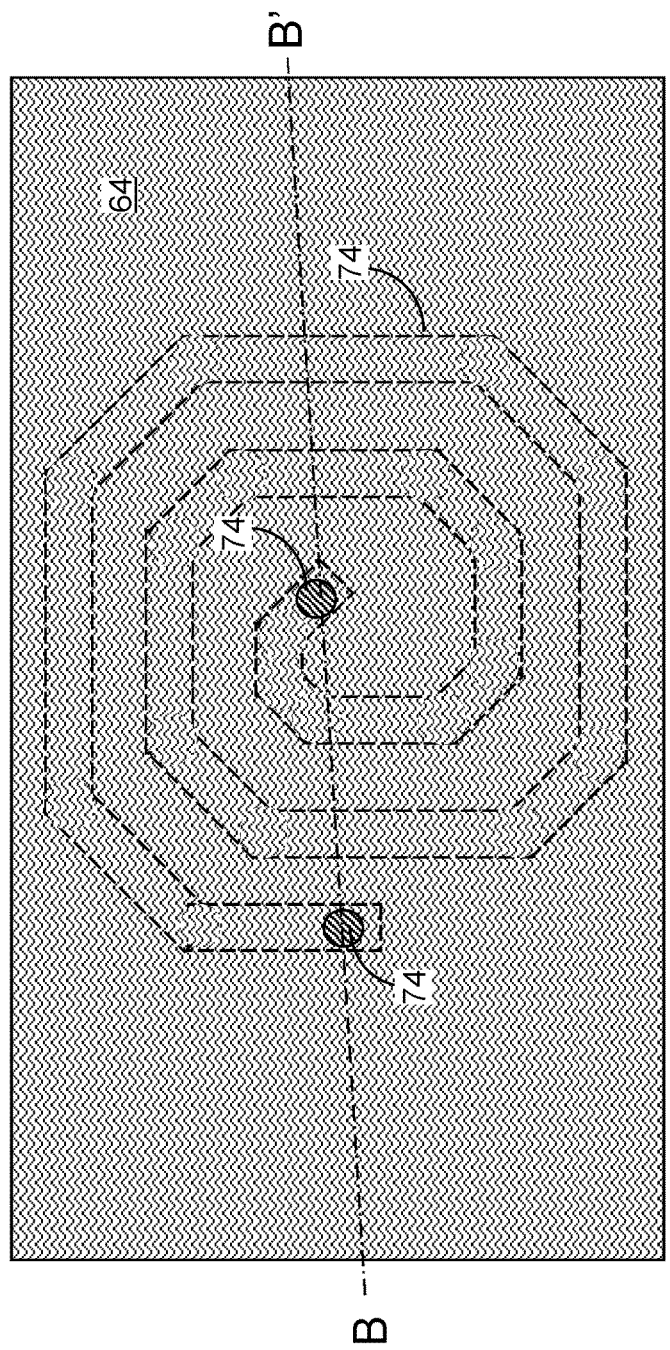
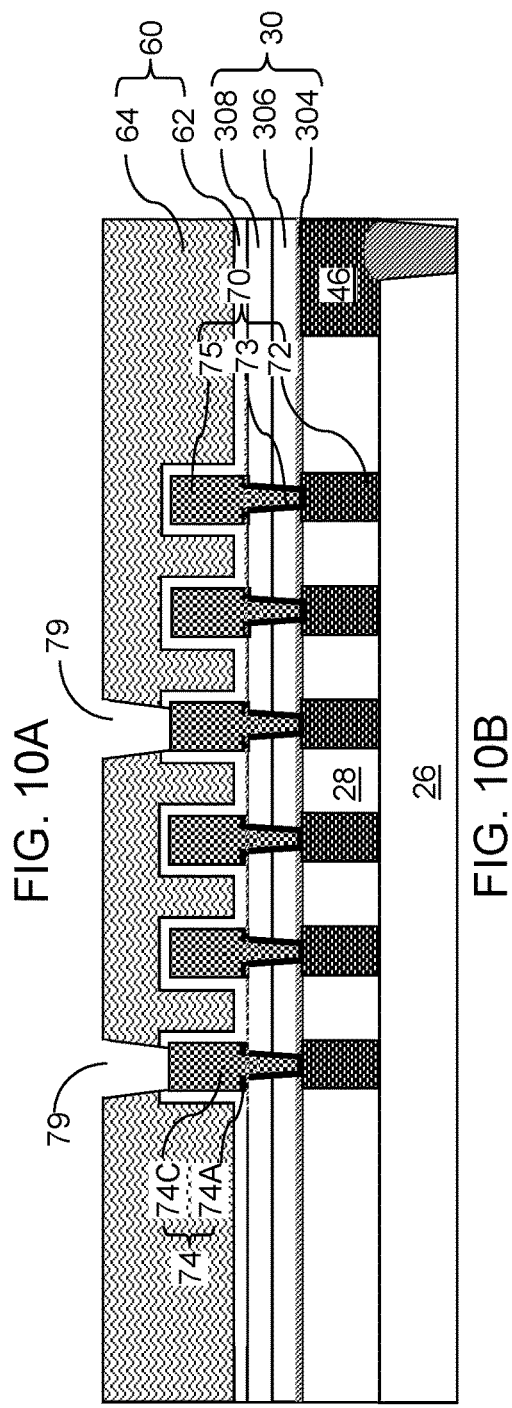
FIG. 10A
FIG. 10B

US 11,348,884 B1

ORGANIC INTERPOSER INCLUDING A DUAL-LAYER INDUCTOR STRUCTURE AND METHODS OF FORMING THE SAME

BACKGROUND

A fan-out wafer level package (FOWLP) may use an interposer between semiconductor dies and a package substrate. An acceptable interposer possesses sufficient mechanical strength to withstand bonding processes used to attach the semiconductor dies and the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a top-down view of region B of FIG. 1A after formation of a patterned photoresist layer according to an embodiment of the present disclosure.

FIG. 5B is a vertical cross-sectional view along the plane B-B' of FIG. 5A.

FIG. 6A is a top-down view of region B of FIG. 1A after formation of a continuous conductive structure including a conductive via structure and an upper conductive coil according to an embodiment of the present disclosure.

FIG. 6B is a vertical cross-sectional view along the plane B-B' of FIG. 6A.

FIG. 9A is a top-down view of region B of FIG. 1A after formation of a dielectric passivation layer according to an embodiment of the present disclosure.

FIG. 9B is a vertical cross-sectional view along the plane B-B' of FIG. 9A.

FIG. 10A is a top-down view of region B of FIG. 1A after formation of a bonding-level polymer layer and formation of bonding-level via cavities according to an embodiment of the present disclosure.

FIG. 10B is a vertical cross-sectional view along the plane B-B' of FIG. 10A.

DETAILED DESCRIPTION

Figure 1A:
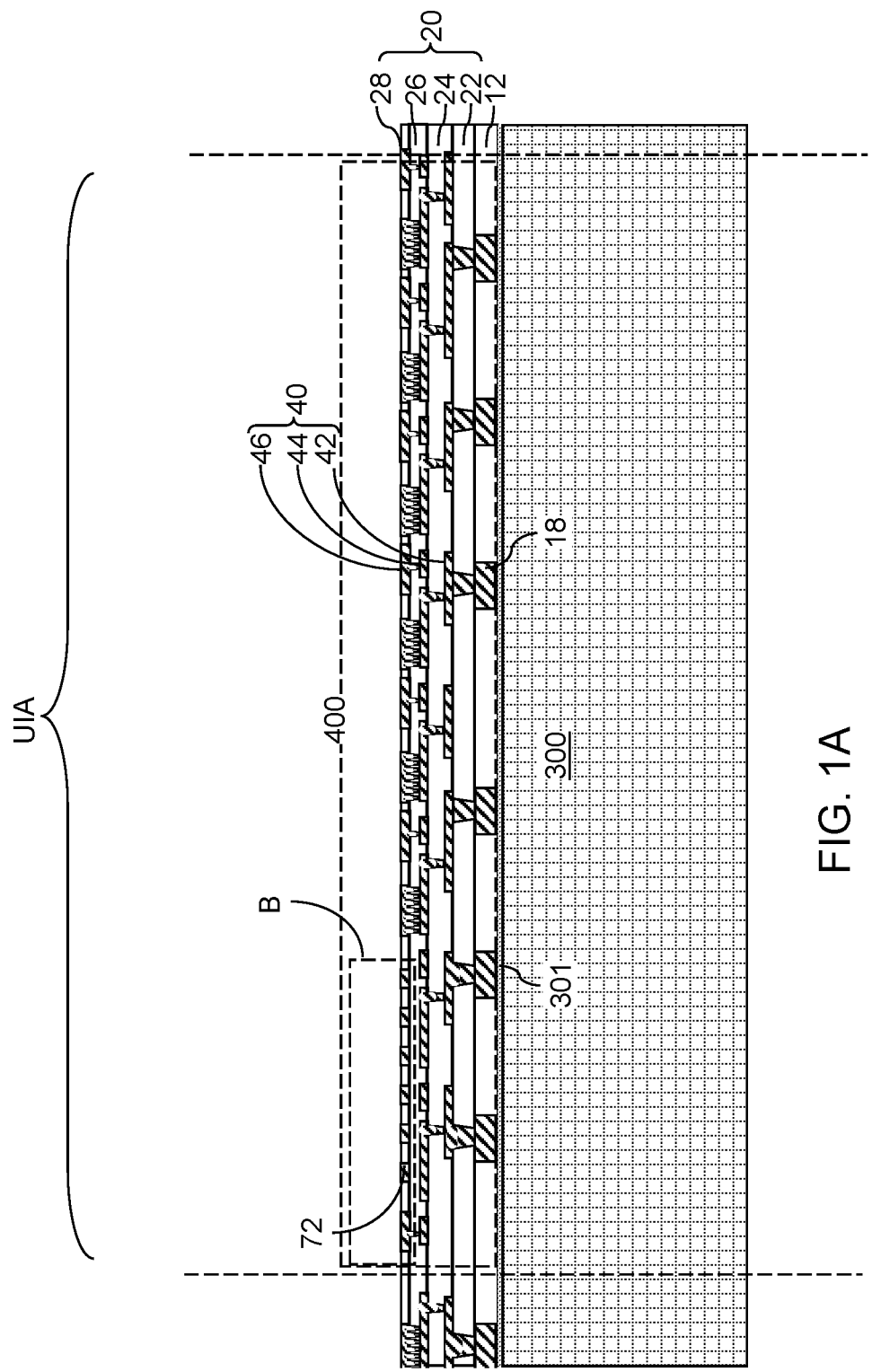
FIG. 1A is a vertical cross-sectional view of an exemplary structure after formation of a lower inductive coil in each in-process organic interposer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an organic interposer including an inductor structure and a method of forming the same, the various aspects of which are now described in detail.

Figure 1B:
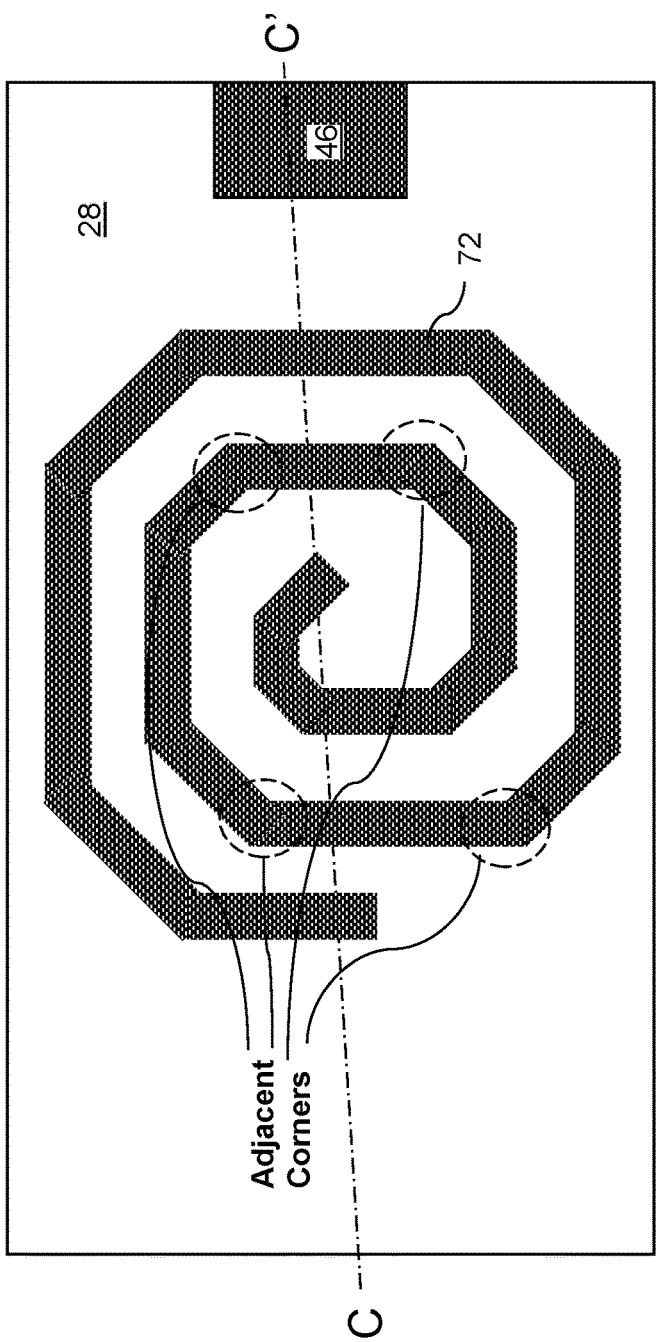
FIG. 1B is a top-down view of region B of FIG. 1A.
Figure 1C:
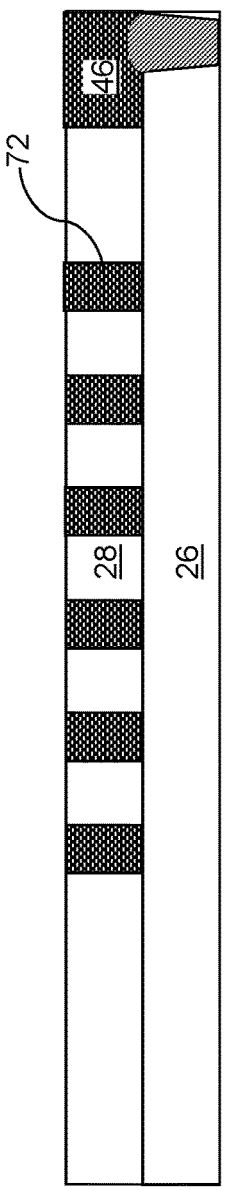
FIG. 1C is a vertical cross-sectional view along the plane C-C' of FIG. 1B.

Generally, the methods and structures of the present disclosure may be used to provide an organic interposer including an inductor structure that may be directly bonded to a semiconductor die. Specifically, the inductor structure may include a lower conductive coil, an upper conductive coil including copper, and a conductive via structure connecting the upper conductive coil and the lower conductive coil. Copper-based bump structures may be provided directly on the upper conductive coil. The inductor structure may be copper-based, and may be free of aluminum. The various aspects of the methods and structures of embodiments of the present disclosure are now described with reference to the accompanying drawings FIG. 1A is a vertical cross-sectional view of an exemplary structure after formation of a lower inductive coil in each in-process organic interposer according to an embodiment of the present disclosure. FIG. 1B is a top-down view of inductor region B of FIG. 1A. FIG. 1C is a vertical cross-sectional view along the plane C-C' of FIG. 1B.

The exemplary structure illustrated in FIGS. 1A-1C includes organic interposers 400 formed over a carrier substrate 300. Each organic interposer 400 may be formed within a respective unit interposer area UIA. A two-dimensional array of organic interposers 400 may be formed on the carrier substrate 300. An organic interposer refers to an interposer including at least one organic insulating material such as an organic polymer matrix material. Each organic interposer 400 may be formed within a respective unit interposer area UIA. The carrier substrate 300 may be a circular wafer or a rectangular wafer. The lateral dimensions (such as the diameter of a circular wafer or a side of a rectangular wafer) of the carrier substrate 300 may be in a range from 100 mm to 500 mm, such as from 200 mm to 400 mm, although lesser and greater lateral dimensions may also be used. The carrier substrate 300 may include a semiconductor substrate, an insulating substrate, or a conductive substrate. The carrier substrate 300 may be transparent or opaque. The thickness of the carrier substrate 300 may be sufficient to provide mechanical support to an array of organic interposers 400 to be subsequently formed thereupon. For example, the thickness of the carrier substrate 300 may be in a range from 60 microns to 1 mm, although lesser and greater thicknesses may also be used.

An adhesive layer 301 may be applied to the top surface of the carrier substrate 300. In one embodiment, the carrier substrate 300 may include an optically transparent material such as glass or sapphire. In this embodiment, the adhesive layer 301 may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 400 degrees. Other suitable thermally decomposing adhesive materials that decompose at other temperatures are within the contemplated scope of disclosure.

Bump structures may be subsequently formed over the adhesive layer 301. The bump structures may be subsequently used to provide bonding to a package substrate, and thus, are herein referred to as package-side bump structures 18. The package-side bump structures 18 may include any metallic material that may be bonded to a solder material. For example, an underbump metallurgy (UBM) layer stack may be deposited over the adhesive layer 301. The order of material layers within the UBM layer stack is selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack comprise the package-side bump structures 18. In one embodiment, the package-side bump structure 18 may be arranged as a two-dimensional array, which may be a two-dimensional periodic array such as a rectangular periodic array. In one embodiment, the package-side bump structures 18 may be formed as controlled collapse chip connection (C4) bump structures.

A dielectric material layer, which is herein referred to as a package-side dielectric material layer 12, may be deposited over the package-side bump structure 18. The package-side dielectric material layer 12 may include a dielectric polymer material such as polyimide (PI), benzocyclobutene (BCB), or polybenzobisoxazole (PBO). Other suitable materials are within the contemplated scope of disclosure. The thickness of the package-side dielectric material layer 12 may be in a range from 4 microns to 60 microns, although lesser and greater thicknesses may also be used.

Redistribution interconnect structures 40 (i.e., 42, 44, 46) and additional dielectric material layers may be subsequently formed over the package-side bump structures 18 and the package-side dielectric material layer 12. The additional dielectric material layers (i.e., 22, 24, 26, 28) are herein referred to collectively as interconnect-level dielectric material layers 20. The interconnect-level dielectric material layers 20 may include a plurality of dielectric material layers (22, 24, 26, 28) such as a first dielectric material layer 22, a second dielectric material layer 24, a third dielectric material layer 26, and a fourth dielectric material layer 28. While the present disclosure is described using an embodiment in which four dielectric material layers (22, 24, 26, 28) embed redistribution interconnect structures 40, embodiments are expressly contemplated herein in which the interconnect-level dielectric material layers 20 include two, three, or five or more dielectric material layers.

Generally, at least one of the interconnect-level dielectric material layers (22, 24, 26, 28) may include an organic polymer matrix layer, i.e., a continuous material layer that includes, and/or consists essentially of, an organic polymer. In one embodiment, each of the interconnect-level dielectric material layers (22, 24, 26, 28) may include an organic polymer matrix layer. Thus, an organic interposer to be subsequently formed includes at least one organic polymer matrix layer.

The redistribution interconnect structures 40 include multiple levels of redistribution interconnect structures 40 that may be formed through a respective one of the dielectric material layers (22, 24, 26, 28). The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an illustrative example, the redistribution interconnect structures 40 may include first redistribution interconnect structures 42 that are formed through, and/or on a top surface of, the first dielectric material layer 22; second redistribution interconnect structures 44 that are formed through, and/or on a top surface of, the second dielectric material layer 24; and third redistribution interconnect structures 46 that are formed through, and/or on a top surface of, the third dielectric material layer 26. While the present disclosure is described using an embodiment in which the redistribution interconnect structures 40 are embedded within four dielectric material layers (22, 24, 26, 28), embodiments are expressly contemplated herein in which the redistribution interconnect structures 40 are embedded within one, two, three, or five or more dielectric material layers.

Each of the interconnect-level dielectric material layers 20 may include a dielectric polymer material such as polyimide (PI), benzocyclobutene (BCB), or polybenzobisoxazole (PBO). Other suitable materials are within the contemplated scope of disclosure. The thickness of each interconnect-level dielectric material layer 20 may be in a range from 4 microns to 20 microns, although lesser and greater thicknesses may also be used. Each of the redistribution interconnect structures 40 includes at least one metallic material such as Cu, Mo, Co, Ru, W, TiN, TaN, WN, or a combination or a stack thereof. Other suitable materials are within the contemplated scope of disclosure. For example, each of the redistribution interconnect structures 40 may include a layer stack of a TiN layer and a Cu layer. In embodiments in which a redistribution interconnect structure 40 include a metal line structure, the thickness of the metal line structure may be in a range from 2 microns to 20 microns, although lesser and greater thicknesses may also be used.

According to an embodiment of the present disclosure, a lower conductive coil 72 may be formed within the topmost line level of the redistribution interconnect structures 40. The lower conductive coil 72 may be embedded within a topmost layer selected from the interconnect-level dielectric material layers (22, 24, 26, 28). In an illustrative example, if the interconnect-level dielectric material layers (22, 24, 26, 28) include four interconnect-level dielectric material layers, the lower conductive coil 72 may be formed within the fourth dielectric material layer 28.

For example, the third dielectric material layer 26 may be deposited over the second dielectric material layer 24 and the second redistribution interconnect structures 44 such that the top surface of the third dielectric material layer 26 is vertically spaced from, and overlies, top surfaces of the second redistribution interconnect structures 44. Via cavities may be formed through the third dielectric material layer 26 such that a top surface of a second redistribution interconnect structure 44 is physically exposed at the bottom of each via cavity. At least one metallic material may be deposited in the via cavities and over the third dielectric material layer 26 to form the third redistribution interconnect structures 46. A dielectric material may be deposited and planarized to form the fourth dielectric material layer 28. In one embodiment, the fourth dielectric material layer 28 may include an organic polymer matrix layer. In another embodiment, the fourth dielectric material layer 28 may include a silicon oxide layer. The dielectric material of the fourth dielectric material layer 28 may be deposited and planarized after formation of the third redistribution interconnect structures 46. Alternatively, the dielectric material of the fourth dielectric material layer 28 may be deposited after deposition of the dielectric material of the third dielectric material layer 26, and line trenches may be formed in the fourth dielectric material layer 28 and via cavities having an areal overlap with a line trench may be formed through the third dielectric material layer 26 so that a top surface of a second redistribution interconnect structure 44 is physically exposed at the bottom of each via cavity. The via cavities and the line cavities may be concurrently filled with at least one metallic material, and excess portions of the at least one metallic material may be removed from above the horizontal plane including the top surface of the fourth dielectric material layer 28 to form the third redistribution interconnect structures 46.

Generally, the lower conductive coil 72 may be formed concurrently with formation of the third redistribution interconnect structures 46. In one embodiment, second redistribution interconnect structures 44 may be formed, which include line portions that overlie a second dielectric material layer 24. A third dielectric material layer 26 may be subsequently deposited and may be patterned to form via cavities therethrough. Each unit interposer area UTA may include an inductor region "B" within which via cavities are not formed through the third dielectric material layer 26. At least one metallic material may be deposited in the via cavities and over the third dielectric material layer 26, for example, by physical vapor deposition (PVD) and/or electroplating. In one embodiment, the at least one metallic material may consist essentially of copper. In one embodiment, the at least one metallic material may have a thickness in a range from 3 microns to 10 microns.

According to an embodiment of the present disclosure, the at least one metallic material may be patterned to provide the third redistribution interconnect structures 46 and the lower conductive coil 72. Specifically, patterned portions of the at least one metallic material formed outside the inductor region B comprise the third redistribution interconnect structures 46, and a patterned portion of the at least one metallic material formed inside the inductor region comprises the lower conductive coil 72, which is a component of an inductor structure to be subsequently completed. The lower conductive coil 72 may have a spiral shape, i.e., a shape in which a continuous laterally-extending line structure wound in a continuous and gradually widening curve around a central point that s proximal to an inner end of the continuously laterally-extending line structure.

Subsequently, the fourth dielectric material layer 28 may be formed by depositing a dielectric material around the third redistribution interconnect structures 46 and the lower conductive coil 72. The dielectric material may include an organic polymer material, or an inorganic dielectric material such as undoped silicate glass or a doped silicate glass. Excess portions of the dielectric material may be removed from above the horizontal plane including the top surfaces of the third redistribution interconnect structures 46 and the lower conductive coil 72.

In an alternative embodiment, second redistribution interconnect structures 44 may be formed, which include line portions that overlie a second dielectric material layer 24. A third dielectric material layer 26 may be deposited over the second dielectric material layer 24, and a fourth dielectric material layer 28 may be deposited over the third dielectric material layer 26. The fourth dielectric material layer 28 may include a same dielectric material as, or may include a different dielectric material from, the dielectric material of the third dielectric material layer 26. In embodiments in which the fourth dielectric material layer 28 includes the same material as the third dielectric material layer 26, a single dielectric material layer may be used in lieu of a stack of the third dielectric material layer 26 and the fourth dielectric material layer 28.

Line cavities may be formed through the fourth dielectric material layer 28, for example, by application and patterning of a first photoresist layer over the fourth dielectric material layer 28 to form line patterns, and by transfer of the line pattern in the first photoresist layer through the fourth dielectric material layer 28. The first photoresist layer may be removed, for example, by ashing. Via cavities may be formed thorough the third dielectric material layer 26, for example, by application and patterning of a second photoresist layer over the fourth dielectric material layer 28 and in the line trenches to form a via pattern, and by transfer of the via pattern through the third dielectric material layer 26. The second photoresist layer may be subsequently removed, for example, by ashing. Each unit interposer area UTA may include an inductor region B within a spiral-shaped line trench is formed through the fourth dielectric material layer 28. Integrated line and via cavities may be formed outside the inductor region. At least one metallic material may be deposited in the integrated line and via cavities outside the inductor region and in the spiral-shaped line trench in the inductor region, for example, by physical vapor deposition (PVD) and/or electroplating. In one embodiment, the at least one metallic material may consist essentially of copper. In one embodiment, the at least one metallic material may have a thickness in a range from 3 microns to 10 microns.

According to an embodiment of the present disclosure, a planarization process such as a chemical mechanical planarization (CMP) process may be performed to expose the third redistribution interconnect structures 46 and the lower conductive coil 72. Specifically, excess portions of the at least one metallic material may be removed from above the horizontal plane including the top surface of the fourth dielectric material layer 28 by the planarization process. Patterned portions of the at least one metallic material formed outside the inductor region B comprise the third redistribution interconnect structures 46, and a patterned portion of the at least one metallic material formed inside the inductor region B comprises the lower conductive coil 72, which is a component of an inductor structure to be subsequently completed. The lower conductive coil 72 may have a spiral shape, i.e., a shape in which a continuous laterally-extending line structure is wound in a continuous and gradually widening curve around a central point that is proximal to an inner end of the continuously laterally-extending line structure.

In one embodiment, the lower conductive coil 72 may have a uniform width throughout, or within a predominant portion (i.e., a portion that includes more than 50% of the entire volume) of the lower conductive coil 72. The width of a segment of the lower conductive coil 72, as measured between two vertical sidewalls, may be in range from 5 nm to 50 nm, such as from 10 nm to 30 nm, although lesser and greater widths may also be used. The spacing between neighboring segment of the lower conductive coil 72 may be in a range from 3 nm to 60 nm, although lesser and greater spacings may also be used. The number of turns in the lower conductive coil 72 may be in a range from 1.5 to 20, such as from 2 to 10, although lesser and greater number of turns may also be used. In one embodiment, start portions of the lower conductive coil 72 may be located about the middle of two adjacent turns of the lower conductive coil 72. In addition, end portions of the lower conductive coil 72 may be located about the middle of two adjacent turns of the lower conductive coil 72. Generally, the pattern of the lower conductive coil 72 may be any pattern that can the magnetic flux generated by a change in the electrical current between the two ends of the lower conductive coil 72. In an embodiment, the distance from a start portion to the nearest adjacent turn, the width and the spacing of the lower conductive coil 72 may be determined based on a pattern factor, i.e., the percentage of a local area to be covered with the at least one conductive material of the lower conductive coil 72. For example, a target range for the pattern factor may be in a range from 10% to 50%, such as from 15% to 30%. Generally, the lower conductive coil 72 may be embedded within the topmost interconnect-level dielectric material layer (such as the fourth dielectric material layer 28) that embeds the redistribution interconnect structures 40. The top surface of the lower conductive coil 72 may be located within a same horizontal plane as the top surface of the topmost interconnect-level dielectric material layer.

Figure 2A:
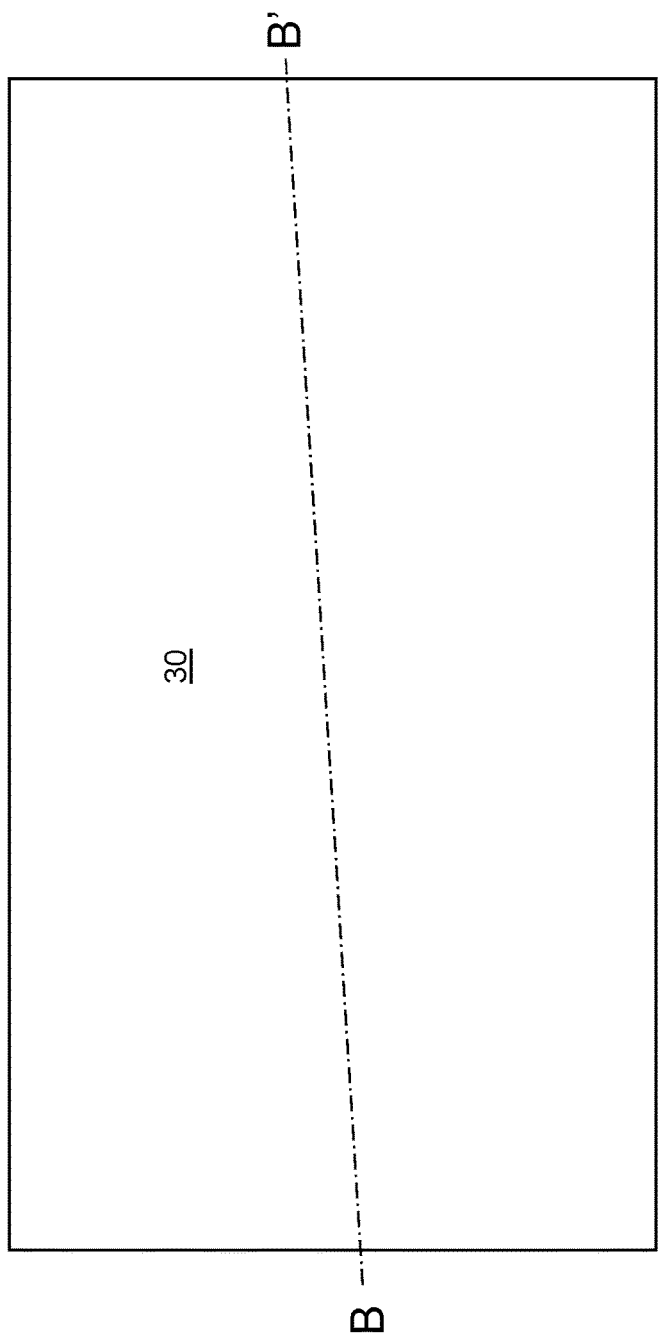
FIG. 2A is a top-down view of region B of FIG. 1A after formation of at least one dielectric capping layer according to an embodiment of the present disclosure.
Figure 2B:
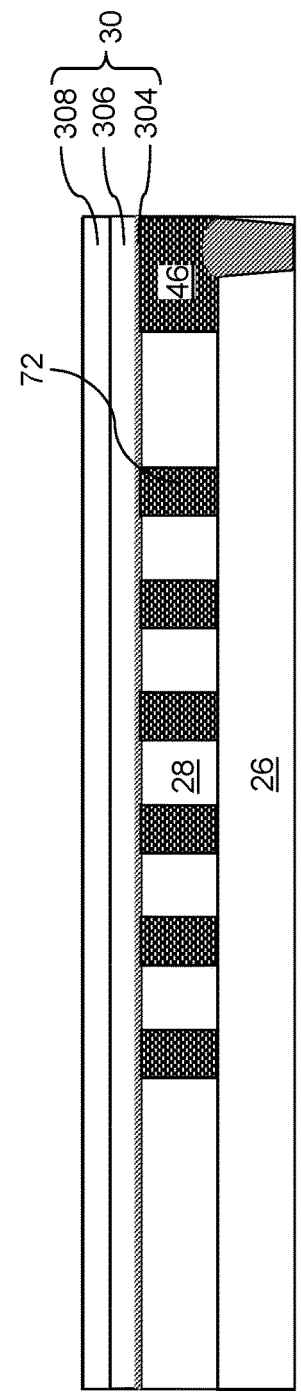
FIG. 2B is a vertical cross-sectional view along the plane B-B' of FIG. 2A.

Referring to FIGS. 2A and 2B, at least one dielectric capping layer 30 may be formed over the topmost interconnect-level dielectric material layer (such as the fourth dielectric material layer 28) selected from the interconnect-level dielectric material layers 20. The at least one dielectric capping layer 30 may include an inorganic dielectric material such as silicon nitride, silicon oxide, silicon oxynitride, silicon oxide carbide, a dielectric metal oxide, or a combination thereof. In a non-limiting illustrative example, the at least one dielectric capping layer 30 may include a layer stack including, from bottom to top, a silicon nitride layer 304, a first silicon oxide layer 306 including a first silicate glass material such as undoped silicate glass, and a second silicon oxide layer 308 including a second silicate glass material such as a doped silicate glass. The total thickness of the at least one dielectric capping layer 30 may be in a range from 200 nm to 4 microns, such as from 400 nm to 2 microns, although lesser and greater thicknesses may also be used. In a non-limiting illustrative example, the silicon nitride layer 301 may have a thickness in a range from 10 nm to 200 nm, the first silicon oxide layer 306 may have a thickness in a range from 80 nm to 2 microns, and the second silicon oxide layer 308 may have a thickness in a range from 80 nm to 2 microns, although lesser and greater thicknesses may be used for each layer.

Figure 3A:
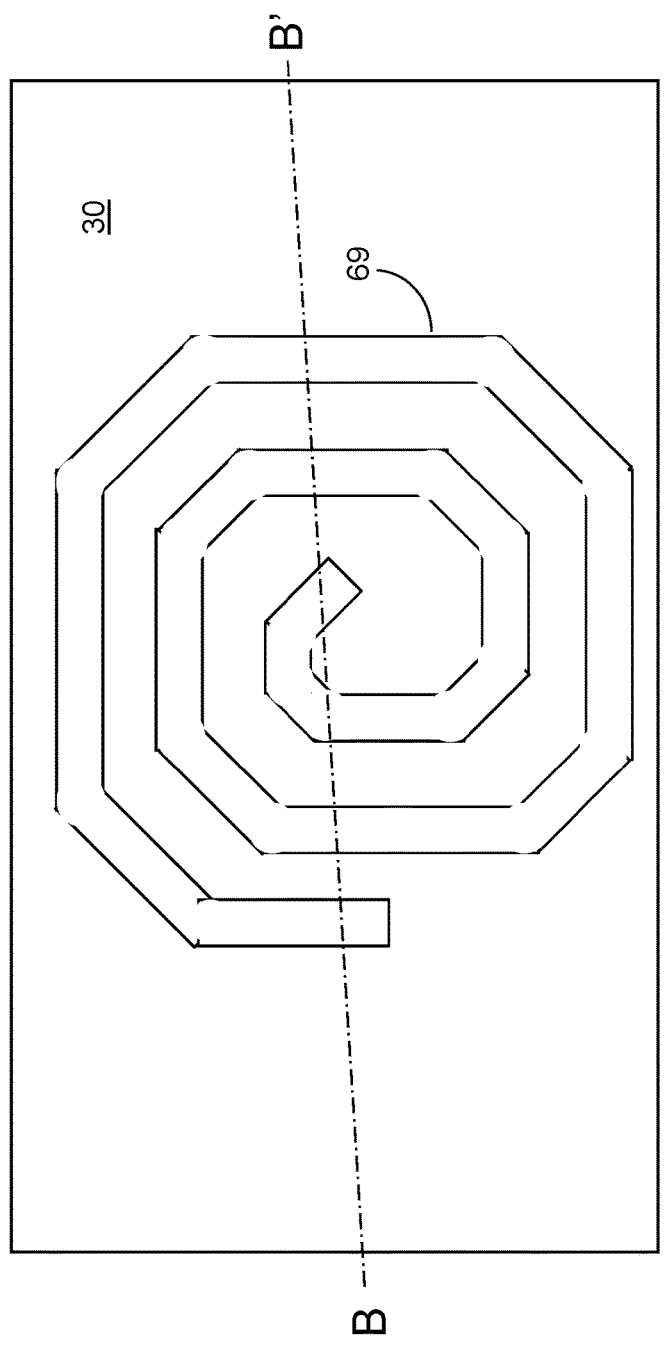
FIG. 3A is a top-down view of region B of FIG. 1A after formation of a via cavity through the at least one dielectric capping layer according to an embodiment of the present disclosure.
Figure 3B:
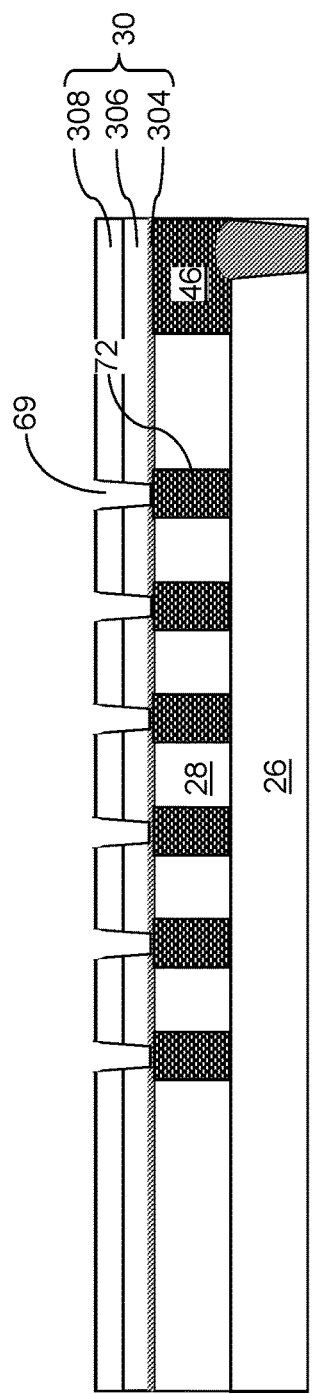
FIG. 3B is a vertical cross-sectional view along the plane B-B' of FIG. 3A.

Referring to FIGS. 3A and 3B, via cavities may be formed through the at least one dielectric capping layer 30. For example, a photoresist layer (not shown) may be applied over the at least one dielectric capping layer 30, and may be lithographically, patterned to form various openings in the photoresist layer. The pattern of the openings in the photoresist layer may be transferred through the at least one dielectric capping layer 30 by performing one or more anisotropic etch processes. The via cavities vertically extending through the at least one dielectric capping layer 30 includes a spiral-shaped via cavity 69 that may be formed within the area of the top surface of the lower conductive coil 72. The silicon nitride layer 304 may used as an etching stop layer in the etch process, and be etched through to expose the underlying lower conductive coil 72. The lower conductive coil 72 is omitted in FIG. 3A to clearly illustrate the spiral-shaped via cavity 69.

Figure 4A:
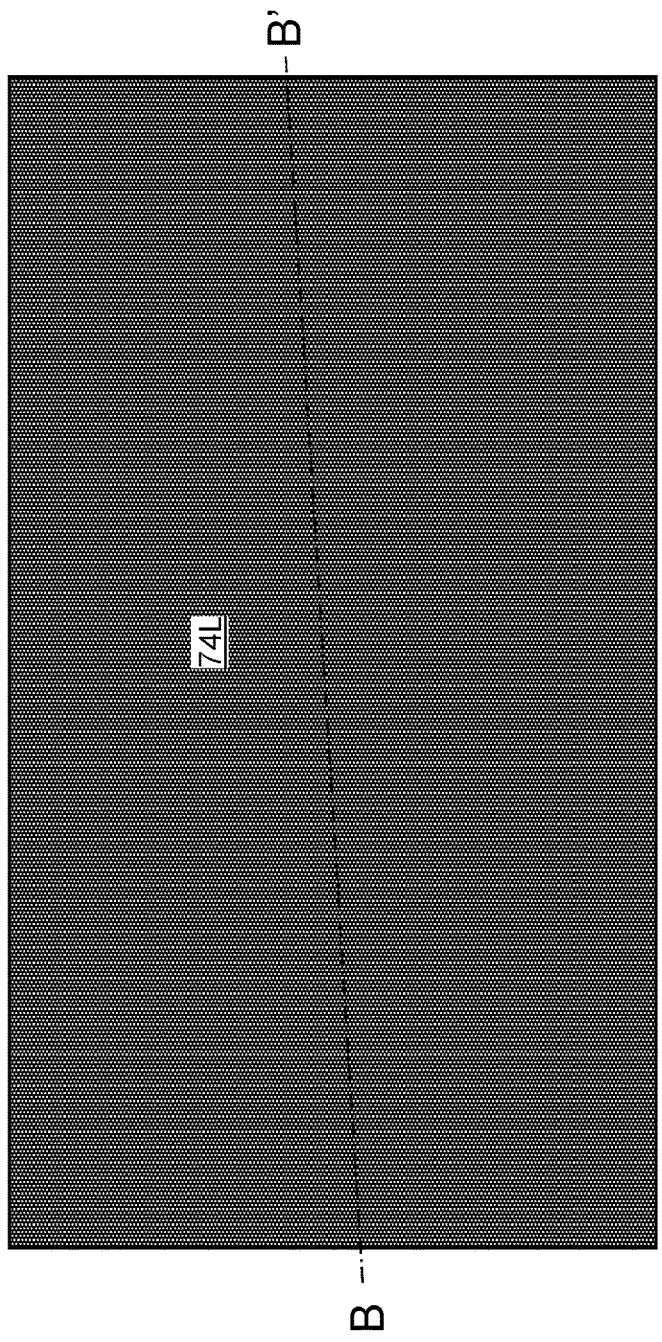
FIG. 4A is a top-down view of region B of FIG. 1A after formation of a metallic seed layer according to an embodiment of the present disclosure.
Figure 4B:
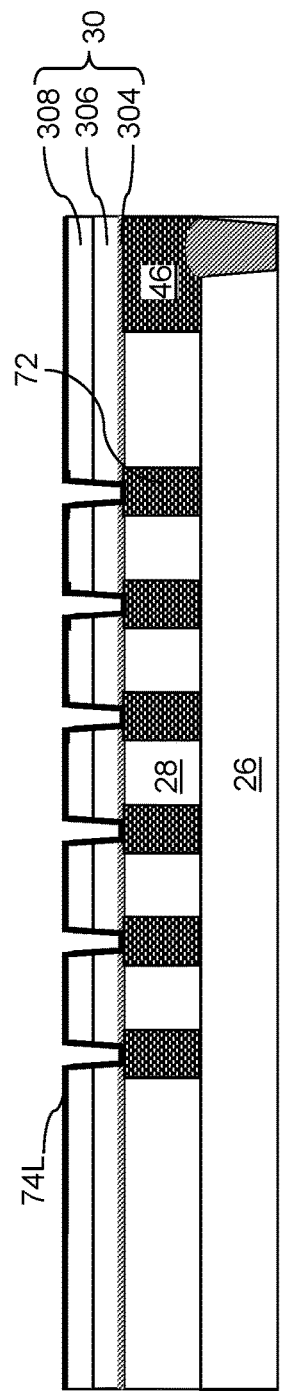
FIG. 4B is a vertical cross-sectional view along the plane B-B' of FIG. 4A.

Referring to FIGS. 4A and 4B, a continuous metallic seed layer 74L may be deposited in the various via cavities in the at least one dielectric capping layer 30 and over the at least one dielectric capping layer 30. The continuous metallic seed layer 74L includes a metallic material such as a conductive metallic nitride material (such as TiN, TaN, and/or WN) and/or copper, and may be deposited by physical vapor deposition. The continuous metallic seed layer 74L may have a thickness in a range from 5 nm to 100 nm, although lesser and greater thicknesses may also be used.

Referring to FIGS. 5A and 5B, a photoresist layer 71 may be applied over the continuous metallic seed layer 74L, and may be lithographically patterned to form various openings over areas of the via cavities through the at least one dielectric capping layer 30. The various openings in the photoresist layer 71 include a spiral-shaped opening that includes the entire area of the spiral-shaped via cavity 69. Further, additional openings (not shown) may be formed in the photoresist layer 71 outside the area of the inductor region over a respective one of the via cavities through the at least one dielectric capping layer 30.

Referring to FIGS. 6A and 6B, an electroplating process may be performed to electroplate copper on the physically exposed surfaces of the continuous metallic seed layer 74L. A spiral-shaped copper portion 74C may be formed on the physically exposed surfaces of the continuous metallic seed layer 74L that overlies the spiral-shaped via cavity 69. The thickness of the electroplated copper may be selected such that the spiral-shaped copper portion 74C has a planar top surface. The thickness of the spiral-shaped copper portion 74C, as measured at a sidewall that contacts the photoresist layer 71, may be in a range from 2 microns to 20 microns, such as from 4 microns to 10 microns, although lesser and greater thicknesses may also be used.

Figure 7A:
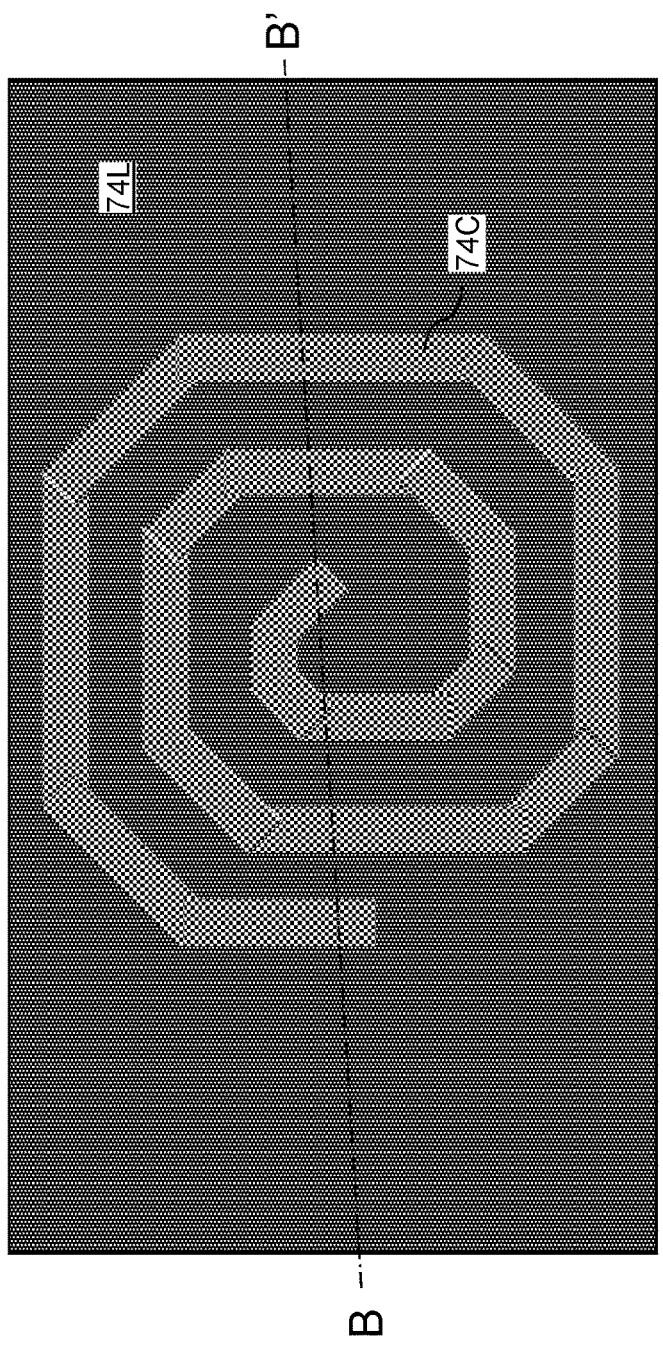
FIG. 7A is a top-down view of region B of FIG. 1A after removal of the patterned photoresist layer according to an embodiment of the present disclosure.
Figure 7B:
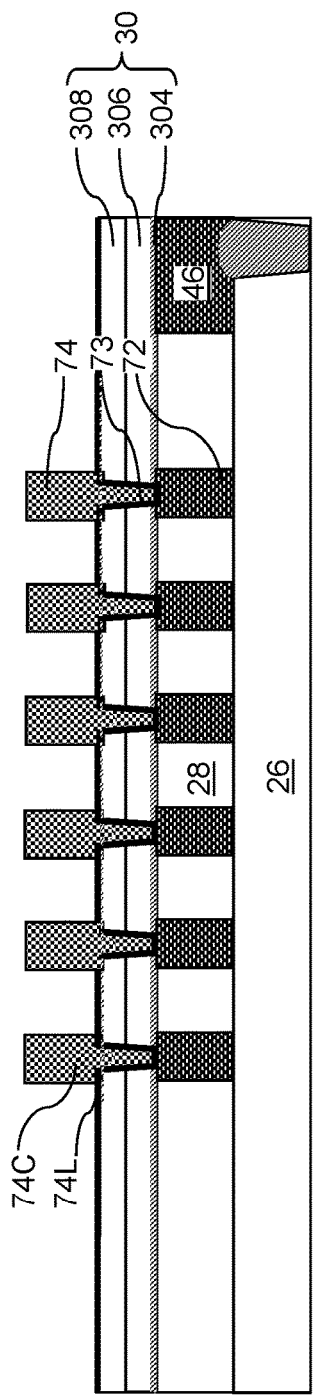
FIG. 7B is a vertical cross-sectional view along the plane B-B' of FIG. 7A.

Referring to FIGS. 7A and 7B, the photoresist layer 71 may be removed, for example, by ashing or by dissolution in a solvent.

Figure 8A:
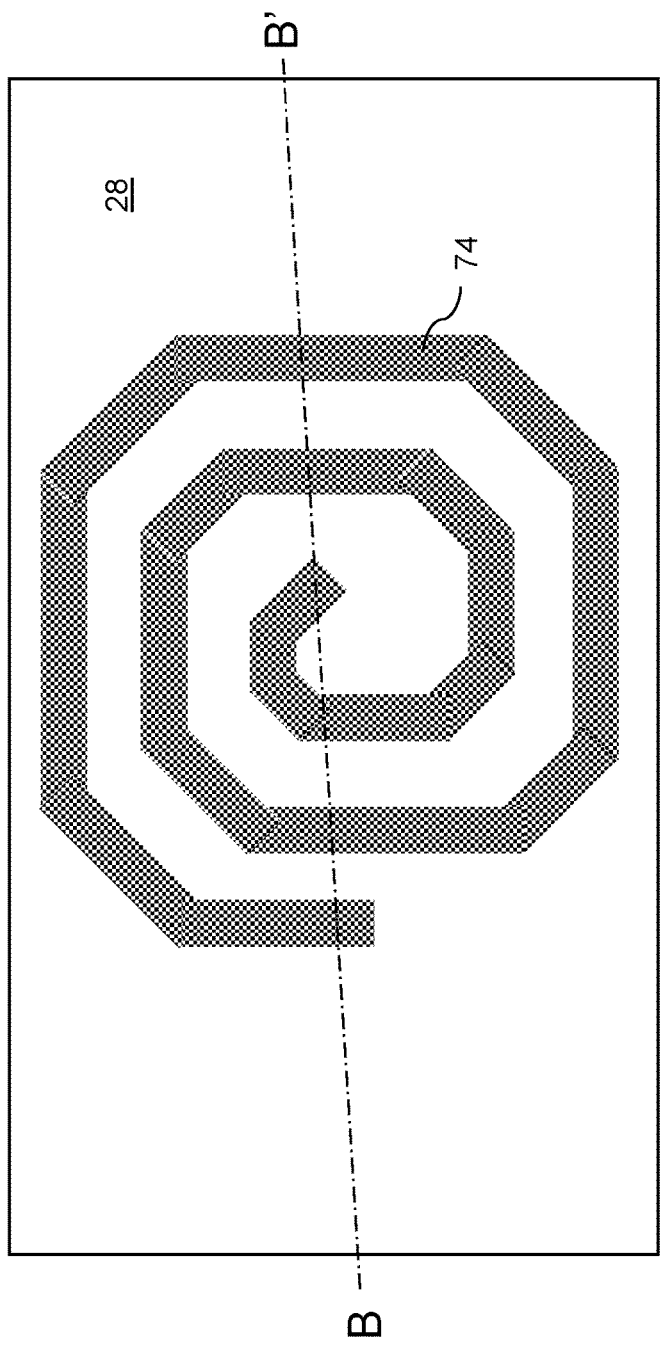
FIG. 8A is a top-down view of region B of FIG. 1A after removal of unmasked portions of the metallic seed layer according to an embodiment of the present disclosure.
Figure 8B:
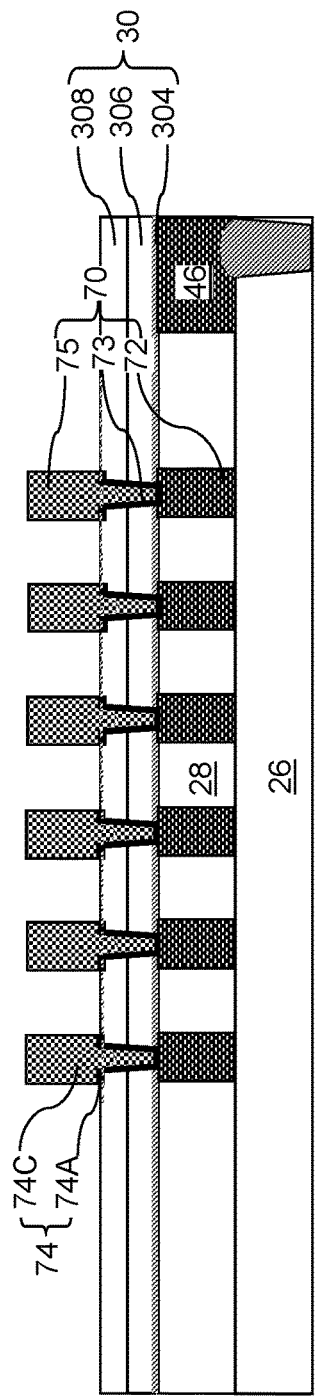
FIG. 8B is a vertical cross-sectional view along the plane B-B' of FIG. 8A.

Referring to FIGS. 8A and 8B, an etch process may be performed to remove portions of the continuous metallic seed layer 74L that are not masked by the spiral-shaped copper portion 74C within the inductor region, or by another portion of the electroplated copper that overlies a respective via cavity through the at least one dielectric capping layer 30. An anisotropic etch process such as a reactive ion etch process, or an isotropic etch process such as a wet etch process may be used to remove portions of the continuous metallic seed layer 74L that are not masked by the spiral-shaped copper portion 74C or by another portion of the electroplated copper. Each patterned portion of the continuous metallic seed layer 74L comprises a respective metallic seed layer 74A.

A combination of the spiral-shaped copper portion 74C and a metallic seed layer 74A that underlies the spiral-shaped copper portion 74C constitutes a continuous conductive structure 74 comprising copper and extending into the spiral-shaped via cavity 69 and over the at least one dielectric capping layer 30. The continuous conductive structure 74 comprises a conductive via structure 73 vertically extending through the at least one dielectric capping layer 30 and contacting the lower conductive coil 72, and an upper conductive coil 75 overlying the at least one dielectric capping layer 30. The combination of the lower conductive coil 72, the conductive via structure 73, and the upper conductive coil 75 comprises a dual-layer inductor structure 70, which is an inductor structure including a lower layer portion comprising the lower conductive coil 72, an upper layer portion comprising the upper conductive coil 75, and a connection portion comprising the conductive via structure having a spiral-shaped horizontal cross-sectional shape.

In one embodiment, the metallic seed layer 74A consists essentially of copper, and the entirety of the dual-layer inductor structure 70 may consist essentially of copper. In another embodiment, the metallic seed layer 74A may consist essentially of a conductive metallic nitride material (such as TiN, TaN, and/or WN), and the dual-layer inductor structure 70 may consist essentially of copper and the conductive metallic nitride material. In one embodiment, the continuous conductive structure 74 may consist essentially of copper, or may consist essentially of copper and the conductive metallic nitride material. In one embodiment, the continuous conductive structure 74 may include copper at an atomic percentage greater than 90% (such as an atomic percentage in a range from 97% to 100%) and may be free of aluminum. In one embodiment, the dual-layer inductor structure 70 may include copper at an atomic percentage greater than 90% (such as an atomic percentage in a range from 97% to 100%) and may be free of aluminum.

Generally, the conductive via structure 73 of the dual-layer inductor structure 70 may comprise a lower portion of a spiral-shaped copper portion 74C that underlies a horizontal plane including a top surface of the at least one dielectric capping layer 30, and the upper conductive coil 75 comprises an upper portion of the spiral-shaped copper portion 74C that overlies the horizontal plane including the top surface of the at least one dielectric capping layer 30.

Referring to FIGS. 9A and 9B, a dielectric passivation layer 62 may be deposited over the dual-layer inductor structure 70 and other metallic structures (not illustrated) that are formed through, and over, the at least one dielectric capping layer 30 such as metallic pad and via structures (not illustrated) that contact a top surface of a respective third redistribution interconnect structures 46. In one embodiment, the dielectric passivation layer 62 may include an inorganic dielectric material such as silicon nitride. In one embodiment, the dielectric passivation layer 62 may include a silicon nitride layer having a thickness in a range from 300 nm to 1.5 microns, although lesser and greater thicknesses may also be used.

Referring to FIGS. 10A and 10B, a bonding-level polymer layer 64 may be applied over the dielectric passivation layer 62. The bonding-level polymer layer 64 may include a photosensitive polymer material such as polyimide. The combination of the dielectric passivation layer 62 and the boding-level polymer layer 64 is herein referred to as a bonding-level dielectric layer 60. The bonding-level polymer layer 64 may be patterned to form a pair of openings 79 over end portions of the dual-layer inductor structures 70, and to form additional openings (not illustrated) in areas that overlie the metallic pad and via structures (not illustrated). An etch process may be performed to transfer the pattern of the openings in the bonding-level polymer layer 64 through underlying portions of the dielectric passivation layer 62. End portions of the top surface of the dual-layer inductor structure 70 (i.e., a continuous conductive structure 74) may be physically exposed. Further, top surfaces of the metallic pad and via structures that are embedded in the at least one dielectric capping layer 30 may be physically exposed.

Figure 11A:
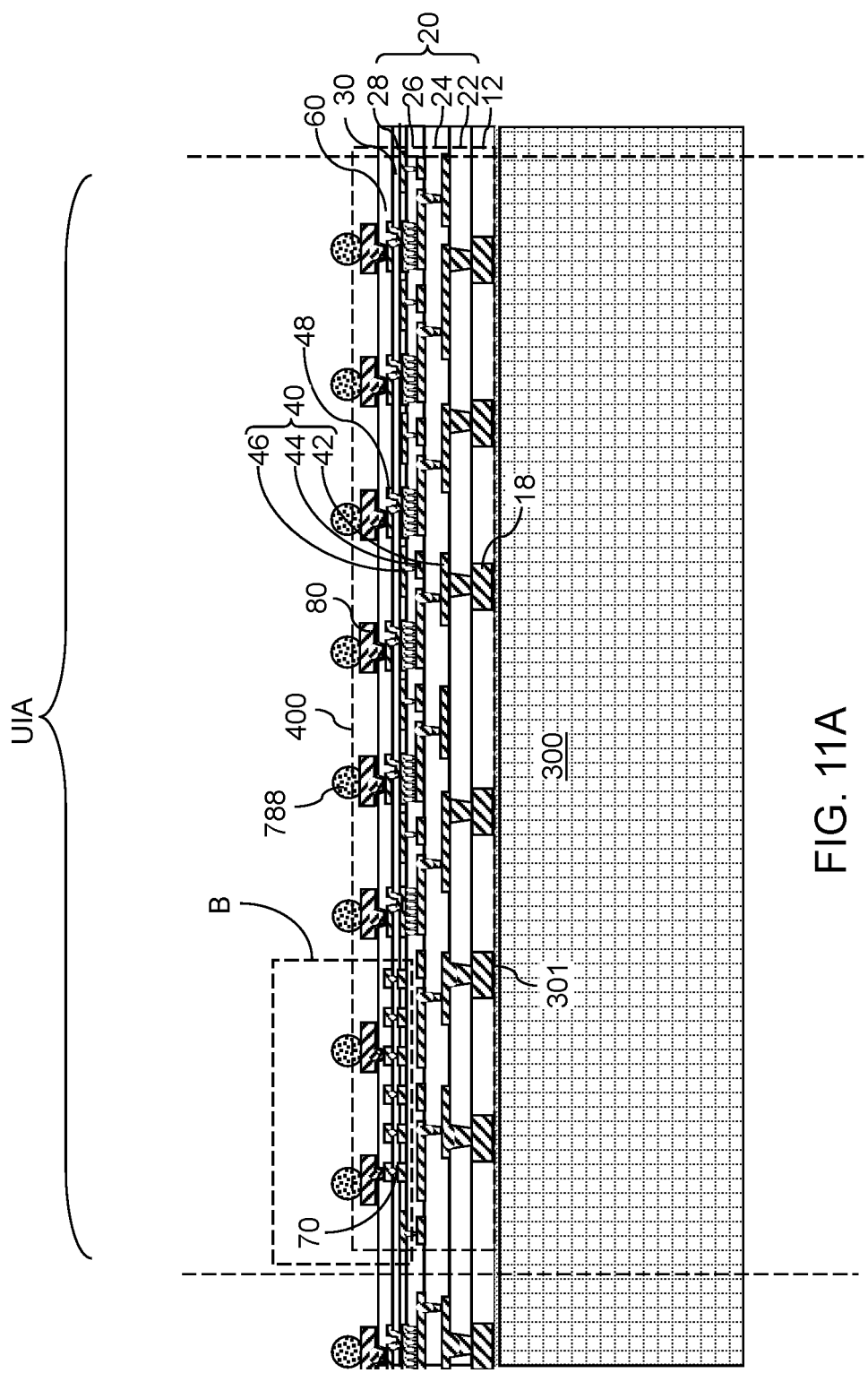
FIG. 11A is a vertical cross-sectional view of the exemplary structure after attaching solder balls to the bump structures according to an embodiment of the present disclosure.
Figure 11B:
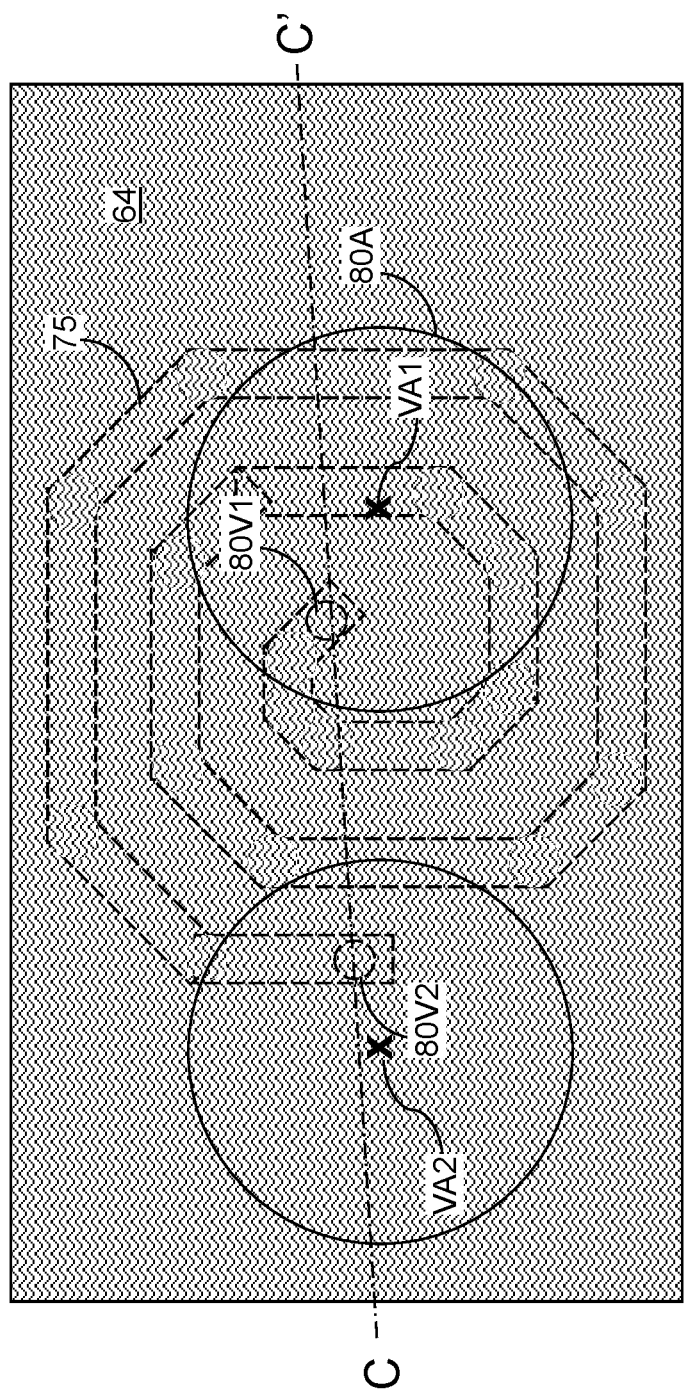
FIG. 11B is a plan view of region B of the exemplary structure of FIG. 11A.
Figure 11C:
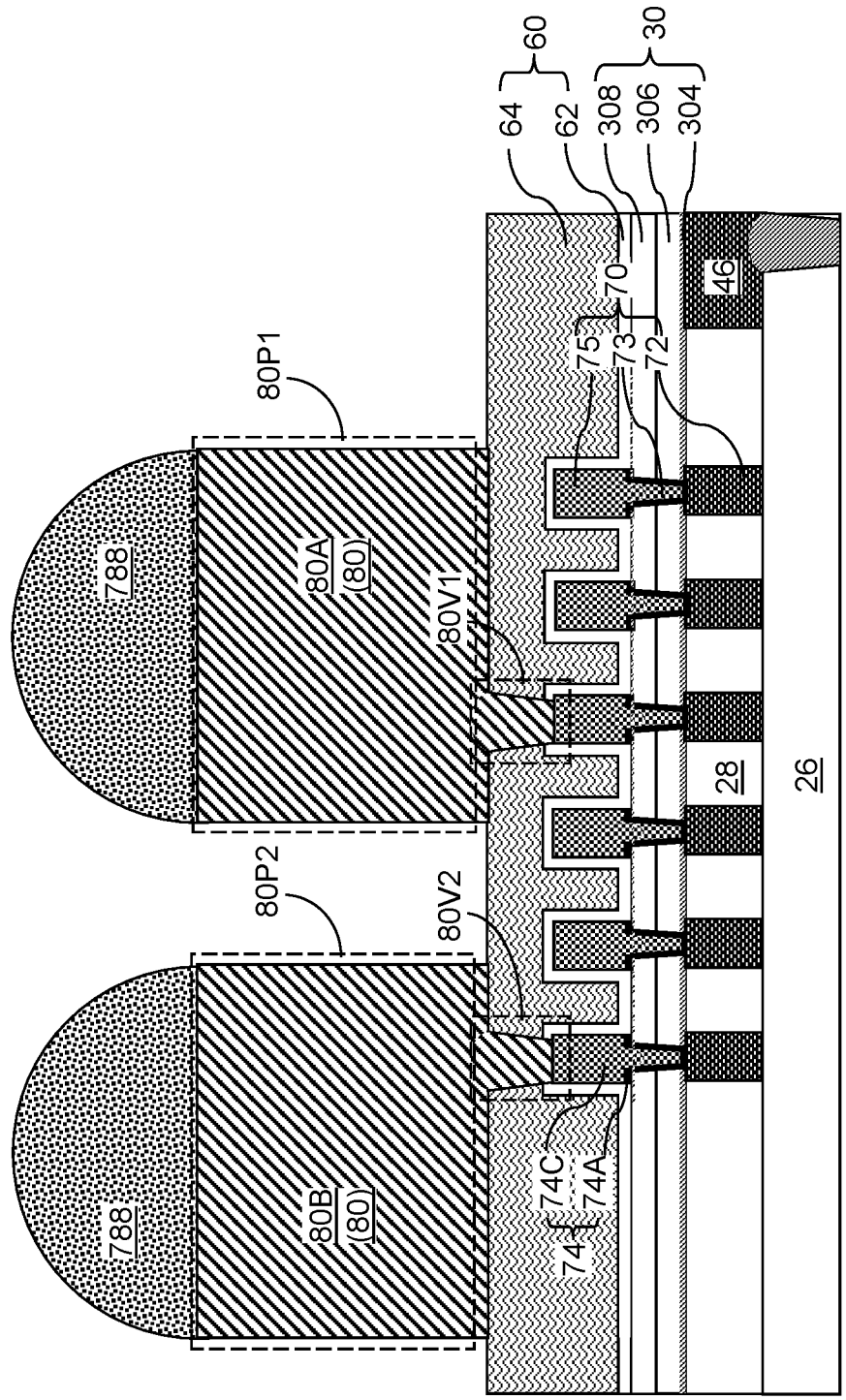
FIG. 11C is a vertical cross-sectional view along vertical plane C-C' of the portion of the exemplary structure of FIG. 11B.

FIG. 11A is a vertical cross-sectional view of the exemplary structure after attaching solder balls to the bump structures according to an embodiment of the present disclosure. FIG. 11B is a plan view of region B of the exemplary structure of FIG. 11A. FIG. 11C is a vertical cross-sectional view along vertical plane C-C' of the portion of the exemplary structure of FIG. 11B.

Referring to FIGS. 11A-11C, copper may be deposited on the physically exposed surfaces of the dual-layer inductor structure 70 and on the physically exposed surfaces of the metallic pad and via structures (not illustrated) that are located outside the inductor region. For example, a copper seed layer or a metallic nitride seed layer (including a metallic nitride material such as TiN, TaN, or WN) may be deposited by physical vapor deposition, and a photoresist layer (not shown) may be deposited over the copper seed layer. An electroplating process may be performed to electroplate copper on unmasked portions of the copper seed layer or the metallic nitride seed layer to form copper bump structures, which are herein referred to as die-side bump structures 80. The die-side bump structures 80 may have a height (as measured between a bottom surface contacting a top surface of the bonding-level dielectric layer 60 to the top surface of the die-side bump structure 80) in a range from 40 microns to 150 microns, such as from 60 microns to 100 microns, although lesser and greater thicknesses may also be used. The photoresist layer may be subsequently removed, for example, by ashing or by dissolution in a solvent.

Generally, the bonding-level dielectric layer 60 over the dual-layer inductor structure 70 may be formed. Bonding-level via cavities may be formed through the bonding-level dielectric layer 60 over the end portions of the dual-layer inductor structure 70. A pair of bump structures 80 may be formed in the bonding-level via cavities and over the bonding-level dielectric layer 60. In one embodiment, the pair of bump structures 80 may include a first bump structure 80A overlying the bonding-level dielectric layer 60 and contacting a top surface of a first end portion of the dual-layer inductor structure 70, and a second bump structure 80B overlying the bonding-level dielectric layer 60 and contacting a top surface of a second end portion of the dual-layer inductor structure 70. The first bump structure 80A includes a first bump via portion 80V1 that extends through the bonding-level dielectric layer 60 and contacting a first end portion of the top surface of the dual-layer inductor structure 70. The second bump structure 80B includes a second bump via portion 80V2 that extends through the bonding-level dielectric layer 60 and contacting a second end portion of the top surface of the dual-layer inductor structure 70.

Generally, metallic pad and via structures 48 may be formed through the fourth dielectric material layer 28 and through, and over, the third dielectric material layer 26 concurrently with formation of the conductive via structure 73 and the upper conductive coil 75. Additional bump structures 80 may be formed through, and over, the bonding-level dielectric layer 60 concurrently with formation of the first bump structure 80A and the second bump structure 80B. The first bump structure 80A, the second bump structure 80B, and the additional bump structure 80 are also referred to as die-side bump structures 80.

According to an embodiment of the present disclosure, an organic interposer 400 may be provided, which comprises interconnect-level dielectric material layers 20 embedding redistribution interconnect structures 40; at least one dielectric capping layer 30 overlying a topmost interconnect-level dielectric material layer (such as the fourth dielectric material layer 28) selected from the interconnect-level dielectric material layers 20; a bonding-level dielectric layer 60 overlying the at least one dielectric capping layer 30; and a dual-layer inductor structure 70 that comprises: a lower conductive coil 72 embedded within the topmost interconnect-level dielectric material layer, a conductive via structure 73 vertically extending through the at least one dielectric capping layer 30 and contacting horizontal surfaces of the lower conductive coil 72; and an upper conductive coil 75 embedded within the bonding-level dielectric layer 60 and comprising copper. In one embodiment, the dual-layer inductor structure 70 may consist essentially of copper, or may include copper at an average atomic percentage in a range from 90% to 100%, such as from 95% to 100%.

In one embodiment, the conductive via structure 73 continuously extends laterally from an area that overlaps with the first bump via portion 80V1 in a plan view to an area that overlaps with the second bump via portion 80V2 in the plan view. A plan view is a view along a direction that is perpendicular to a horizontal direction, i.e., a view along a direction that is perpendicular to the top surface of the dual-layer inductor structure 70 such as the view of FIG. 11B. In one embodiment, the first bump via portion 80V1 is laterally offset from a vertical axis VA1 passing through a geometrical center of the first bump pillar portion 80P1, and the second bump via portion 80V2 is laterally offset from a vertical axis VA2 passing through a geometrical center of the second bump pillar portion 80P2. A geometrical center of an element refers to the point having a Cartesian coordinate that is the average of Cartesian coordinates of all points within the element.

In one embodiment, the upper conductive coil 75 has a spiral configuration in which outer line segments encircle inner line segments, and the first bump structure 80A has an areal overlap with multiple line segments of the upper conductive coil 75 as illustrated in FIG. 11B.

In one embodiment, the organic interposer 400 comprises: metallic pad and via structures 48 (illustrated in FIG. 11A) contacting a respective one of the redistribution interconnect structures 40 and including a respective pad portion that may be embedded within the bonding-level dielectric layer 60 and a respective via portion that may be embedded within the at least one dielectric capping layer 30; and additional bump structures (such as the additional die-side bump structures 80) contacting a respective one of the metallic pad and via structures 48. In one embodiment, the pad portions of the metallic pad and via structure 48 (illustrated in FIG. 11A) may be formed during formation of the upper conductive coil 75, and thus, may have a same thickness as, and have a same material composition as, the upper conductive coil 75. The additional bump structures 80 are formed during formation of the first bump structure 80A and the second bump structure 80B, and thus, may have a same height as, and have a same material composition as, the first bump structure 80A and the second bump structure 80B.

In one embodiment, at least 90% of a total area of the lower conductive coil 72 has an areal overlap with the upper conductive coil 75 in a plan view; and at least 90% of a total area of the upper conductive coil 75 has an areal overlap with the lower conductive coil 72 in the plan view. In one embodiment, at least 95% of a total area of the lower conductive coil 72 has an areal overlap with the upper conductive coil 75 in a plan view; and at least 95% of a total area of the upper conductive coil 75 has an areal overlap with the lower conductive coil 72 in the plan view. In one embodiment, at least 98% of a total area of the lower conductive coil 72 has an areal overlap with the upper conductive coil 75 in a plan view; and at least 98% of a total area of the upper conductive coil 75 has an areal overlap with the lower conductive coil 72 in the plan view.

In one embodiment, each of the lower conductive coil 72, the conductive via structure 73, and the upper conductive coil 75 comprises copper, and/or may consist essentially of copper or of a combination of copper and at least one conductive metallic nitride material (such as TiN, TaN, and/or WN).

In one embodiment, the topmost interconnect-level dielectric material layer comprises a polymer material layer; the at least one dielectric capping layer 30 comprises at least one silicon oxide layer; and the bonding-level dielectric layer 60 comprises a layer stack including a silicon nitride layer and a polyimide layer.

Figure 12:
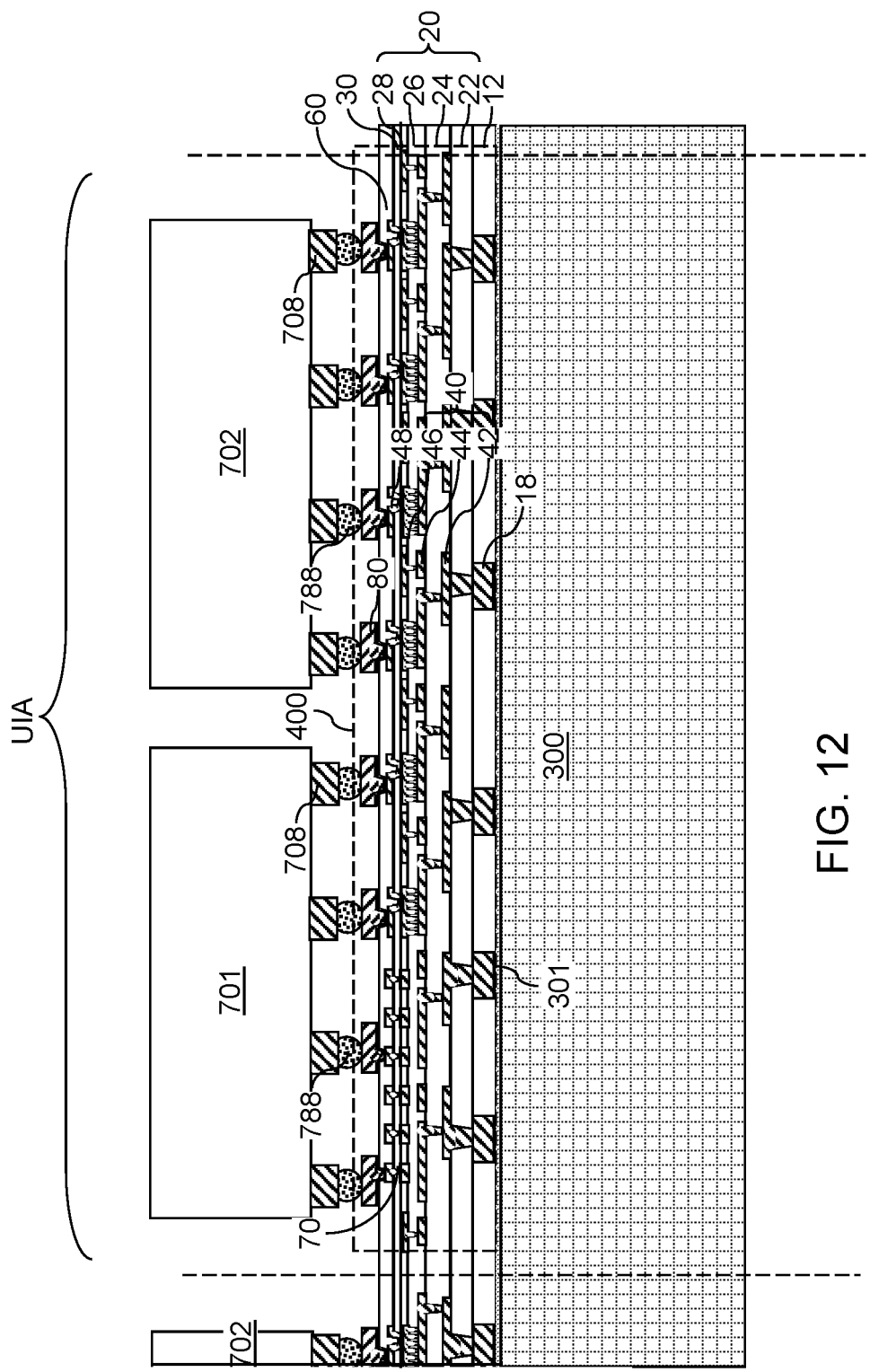
FIG. 12 is a vertical cross-sectional view of the exemplary structure after attaching semiconductor dies to the organic interposers according to an embodiment of the present disclosure.

FIG. 12 is a vertical cross-sectional view of the exemplary structure after attaching semiconductor dies to the organic interposers according to an embodiment of the present disclosure. At least one semiconductor die (701, 702) may be attached to each organic interposer 400. Each semiconductor die (701, 702) may be bonded to a respective subset of the die-side bump structures 80 within a respective unit interposer area UTA through solder material portions 788. Each semiconductor die (701, 702) may comprise die bump structures 708. In one embodiment, the die bump structures 708 may comprise a two-dimensional array of microbump structures, and each semiconductor die (701, 702) may be attached to the die-side bump structure 80 by C2 bonding, i.e., solder bonding between a pair of microbumps. A C2 bonding process that reflows the solder material portions 788 may be performed after the die bump structures 708 of the semiconductor dies (701, 702) are disposed over the array of solder material portions 788.

The at least one semiconductor die (701, 702) may include any semiconductor die known in the art. In one embodiment, the at least one semiconductor die (701, 702) may include a system-on-chip (SoC) die such as an application processor die. In one embodiment, the at least one semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. The top surfaces of the semiconductor dies (701, 702) that are attached to a same organic interposer 400 may be positioned within a same horizontal plane. Generally, at least one semiconductor die (701, 702) may be attached to the die-side bump structures 80 through at least one array of solder material portions 788.

Figure 13:
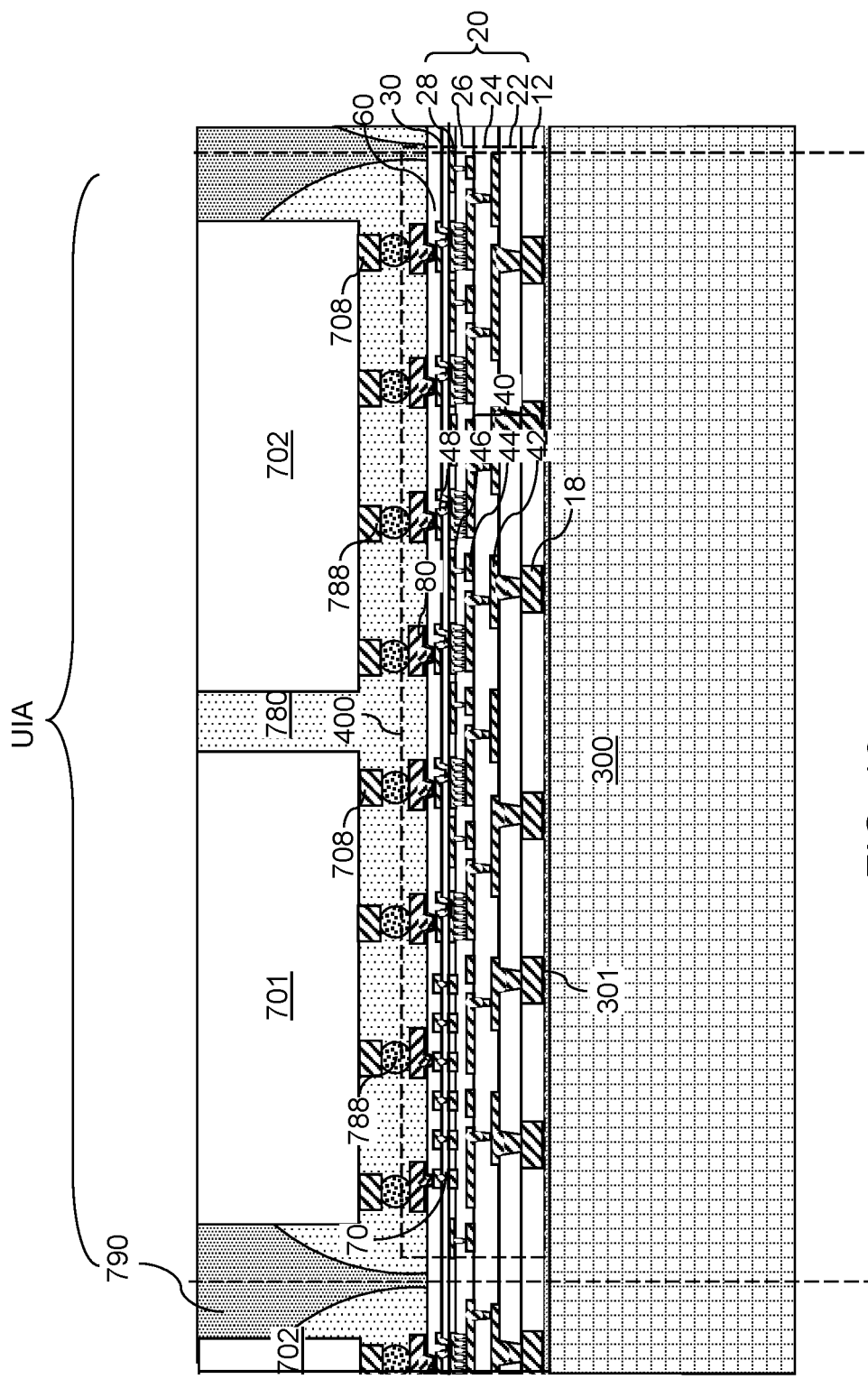
FIG. 13 is a vertical cross-sectional view of the exemplary structure after formation of fan-out wafer-level packages according to an embodiment of the present disclosure.

FIG. 13 is a vertical cross-sectional view of the exemplary structure after formation of fan-out wafer-level packages according to an embodiment of the present disclosure. At least one underfill material portion 780 may be formed around each bonded array of solder material portions 788. Each underfill material portion 780 may be formed by injecting an underfill material around the array of solder material portions 788 after the solder material portions 788 are reflowed. Any known underfill material application method may be used, which may be, for example, the capillary underfill method, the molded underfill method, or the printed underfill method. In one embodiment, a plurality of semiconductor dies (701, 702) may be attached to an organic interposer 400 within each unit interposer area UTA, and a single underfill material portion 780 may continuously extend underneath the plurality of semiconductor dies (701, 702).

An epoxy molding compound (EMC) is applied to the gaps formed between the organic interposers 400 and the semiconductor dies (701, 702). The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301. For example, the curing temperature of the EMC may be in a range from 125° C. to 150° C.

The EMC may be cured at a curing temperature to form an EMC matrix that laterally encloses each of the semiconductor dies (701, 702). The EMC matrix includes a plurality of epoxy molding compound (EMC) die frames 790 that are laterally adjoined to one another. Each EMC die frame 790 is located within a respective unit interposer area UTA, and laterally surrounds and embeds a respective set of at least one semiconductor die (701, 702), which may be a plurality of semiconductor dies (701, 702). Excess portions of the EMC may be removed from above the horizontal plane including the top surfaces of the semiconductor dies (701, 702) by a planarization process, which may use chemical mechanical planarization.

Figure 14:
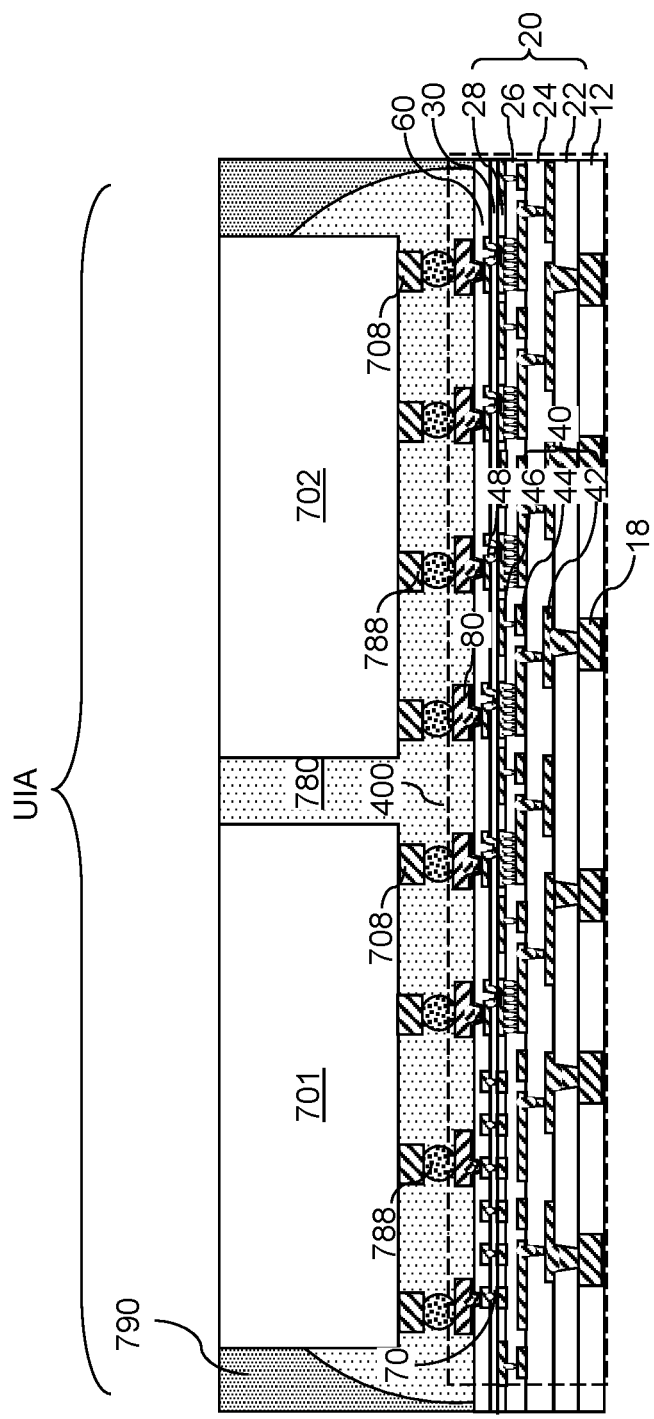
FIG. 14 is a vertical cross-sectional view of the exemplary structure after dicing the fan-out wafer-level packages according to an embodiment of the present disclosure.

FIG. 14 is a vertical cross-sectional view of the exemplary structure after dicing the fan-out wafer-level packages according to an embodiment of the present disclosure. The carrier substrate 300 may be detached from the assembly of the organic interposers 400, the semiconductor dies (701, 702), and the EMC die frames 790. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material.

The assembly of the organic interposers 400, the semiconductor dies (701, 702), and the EMC die frames 790 may be diced along the dicing channels, which are located along the boundaries of the unit interposer areas. Each diced portion of the organic interposers 400, the semiconductor dies (701, 702), and the EMC die frames 790 comprises a fan-out wafer-level package (FOWLP), which includes at least one semiconductor die (701, 702) (which may be a plurality of semiconductor dies), an organic interposer 400, an underfill material portion 780, and an EMC die frame 790. The EMC die frame 790 and the organic interposer 400 may have vertically coincident sidewalls, i.e., sidewalls located within a same vertical plane. In embodiments in which the FOWLP includes a plurality of semiconductor dies (701, 702), the underfill material portion 780 may contact sidewalls of the plurality of semiconductor dies (701, 702). The EMC die frame 790 continuously extends around, and laterally encircles, the at least one semiconductor die (701, 702) within the FOWLP.

Referring collectively to FIGS. 1A-14 and according to an embodiment of the present disclosure, a semiconductor structure comprising an organic interposer 400 is provided. The organic interposer 400 comprises: interconnect-level dielectric material layers 20 embedding redistribution interconnect structures 40; at least one dielectric capping layer 30 overlying a topmost interconnect-level dielectric material layer (such as the fourth dielectric material layer 28) selected from the interconnect-level dielectric material layers 20; a bonding-level dielectric layer 60 overlying the at least one dielectric capping layer 30; and an inductor structure 70 that vertically extends through the topmost interconnect-level dielectric material layer, the at least one dielectric capping layer 30, and the bonding-level dielectric layer 60, comprises copper, and is free of aluminum. In one embodiment, the inductor structure 70 may consist essentially of copper or a combination of copper and at least one conductive metallic nitride material.

In one embodiment, the inductor structure 70 comprises: a lower conductive coil 72 embedded within the topmost interconnect-level dielectric material layer, a conductive via structure 73 vertically extending through the at least one dielectric capping layer 30 and contacting horizontal surfaces of the lower conductive coil 72; and an upper conductive coil 75 embedded within the bonding-level dielectric layer 60 as illustrated in FIGS. 11B and 11C.

In one embodiment, the semiconductor structure comprises a semiconductor die (such as a first semiconductor die 701) bonded to the organic interposer 400 through solder material portions 788 that are bonded to bump structures 80 located on the organic interposer 400. One of the bump structures 80 contacts a top surface of a first end portion of the inductor structure 70; and another of the bump structures 80 contacts a top surface of a second end portion of the inductor structure 70.

Figure 15:
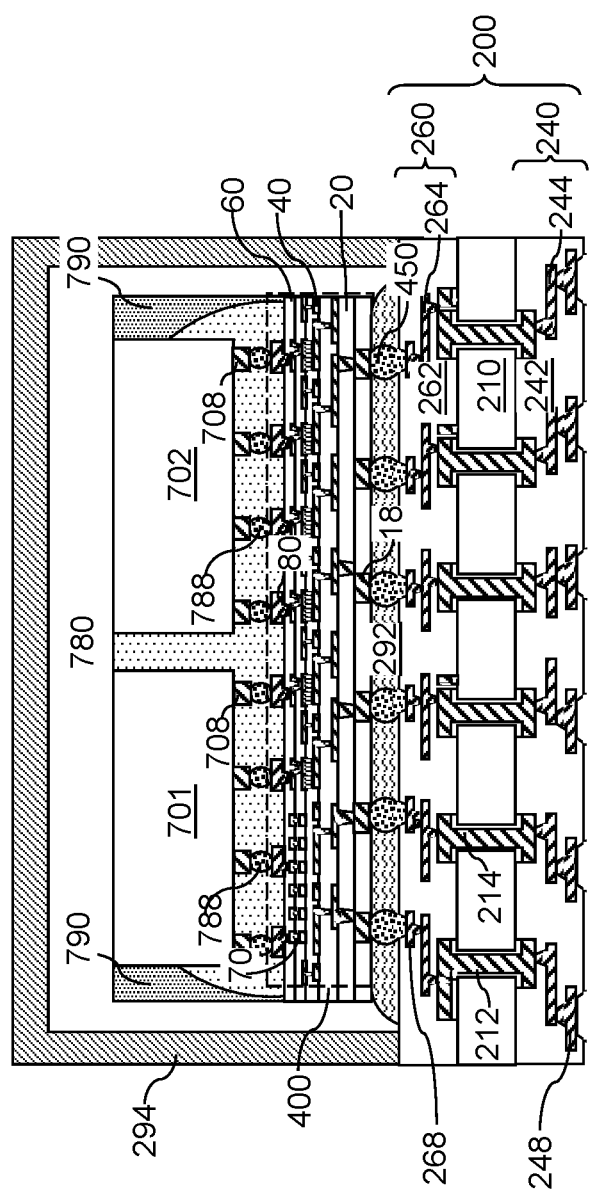
FIG. 15 is a vertical cross-sectional view of the exemplary structure after attaching a package substrate to the fan-out wafer-level package according to an embodiment of the present disclosure.

FIG. 15 is a vertical cross-sectional view of the exemplary structure after attaching a package substrate to the fan-out wafer-level package according to an embodiment of the present disclosure. A package substrate 200 may be provided. The package substrate 200 may be a cored package substrate including a core substrate 210, or a coreless package substrate that does not include a package core. Alternatively, the package substrate 200 may include a system-integrated package substrate (SoIS) including redistribution layers and/or interlayer dielectrics, and at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include a SoIS.

The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bump structures 18 of an assembly of the organic interposer 400, at least one semiconductor die (701, 702), and the EMC die frame 790 may be disposed on the array of the chip-side bonding pads 268 of the package substrate 200. A reflow process may be performed to reflow the solder material portions 450, thereby inducing bonding between the organic interposer 400 and the package substrate 200. In one embodiment, the solder material portions 450 may include C4 solder balls, and the assembly of the organic interposer 400, the at least one semiconductor die (701, 702), and the EMC die frame 790 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the organic interposer 400, the at least one semiconductor die (701, 702), the EMC die frame 790, and the package substrate 200 to reduce deformation of the assembly during subsequent processing steps and/or during usage of the assembly.

Figure 16:
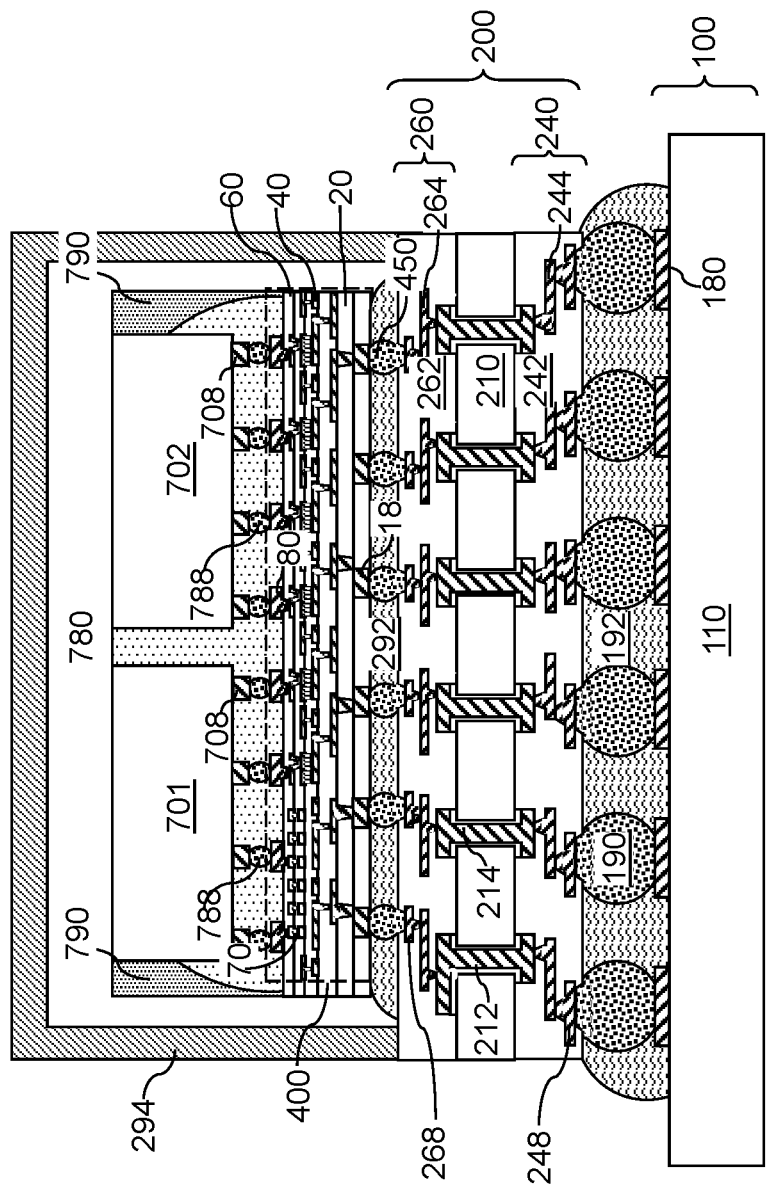
FIG. 16 is a vertical cross-sectional view of the exemplary structure after attaching the package substrate to a printed circuit board (PCB) according to an embodiment of the present disclosure.

FIG. 16 is a vertical cross-sectional view of the exemplary structure after attaching the package substrate to a printed circuit board (PCB) according to an embodiment of the present disclosure. Referring to FIG. 16, a printed circuit board (PCB) 100 including a PCB substrate 110 and PCB bonding pads 180 may be provided. The PCB substrate 110 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB substrate 110 through the array of solder joints 190.

Figure 17:
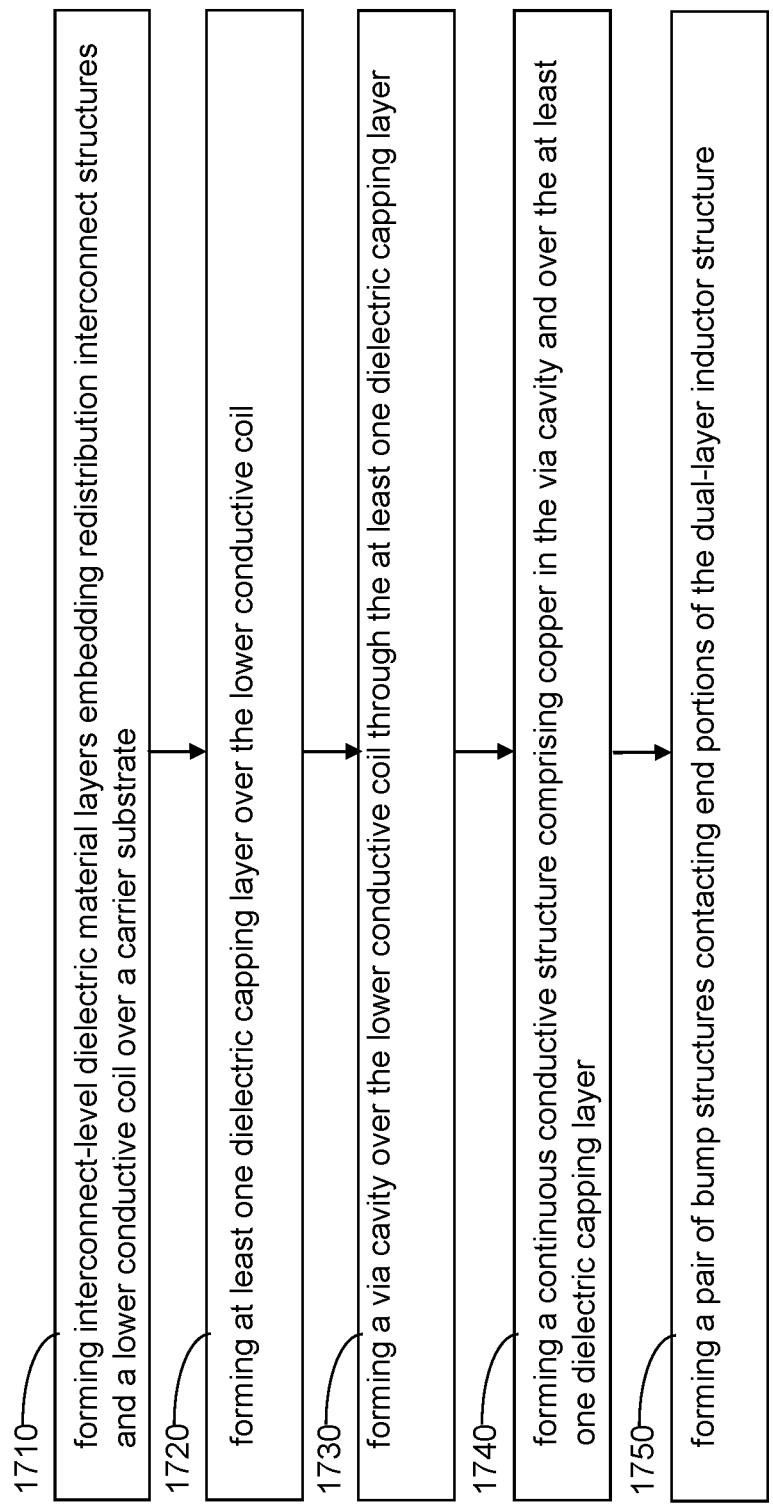
FIG. 17 is a flowchart illustrating steps for forming an organic interposer according to an embodiment of the present disclosure.

Referring to FIG. 17, a flowchart illustrating steps for forming an organic interposer 400 of embodiments of the present disclosure is illustrated. Referring to step 1710 and FIGS. 1A-1C, interconnect-level dielectric material layers 20 embedding redistribution interconnect structures 40 and a lower conductive coil 72 may be formed over a carrier substrate 300. Referring to step 1720 and FIGS. 2A and 2B, at least one dielectric capping layer 30 may be formed over the lower conductive coil. Referring to step 1730 and FIGS. 3A and 3B, a via cavity such as a spiral-shaped via cavity 69 may be formed over the lower conductive coil 72 through the at least one dielectric capping layer 30. Referring to step 1740 and FIGS. 4A-8B, a continuous conductive structure 74 comprising copper may be formed in the via cavity and over the at least one dielectric capping layer 30. The continuous conductive structure 74 comprises a conductive via structure 73 vertically extending through the at least one dielectric capping layer 30 and contacting the lower conductive coil 72, and an upper conductive coil 75 overlying the at least one dielectric capping layer 30. A combination of the lower conductive coil 72, the conductive via structure 73, and the upper conductive coil 75 comprises a dual-layer inductor structure 70. Referring to step 1750 and FIGS. 9A-11C, a pair of bump structures 80 contacting end portions of the dual-layer inductor structure 70 may be formed. Subsequently, the processing steps of FIGS. 12A-18 may be performed as needed.

The various structures and methods of the present disclosure may be used to provide a copper-based inductor structure that does not require use of aluminum. Thus, the copper-based inductor structure of the present disclosure may be free of aluminum, and may consist essentially of copper or a combination of copper and at least one metallic nitride material. The stack of a lower conductive coil 72 and an upper conductive coil 75 provides sufficient conductivity for the inductor structure 70 to effectively function with low resistance and high inductance. The conductive via structure 73 provides electrical connection between the lower conductive coil 72 and the upper conductive coil 75 with low resistance by providing an uninterrupted continuous electrical connection between two end portions of the inductor structure 70. Comparison of samples of the copper-based inductor structure, samples of a single-aluminum-layer inductor structure, and samples of a dual-aluminum-layer inductor structure as manufactured by the inventors demonstrated inductance enhancement of about 28% in the samples of the copper-based inductor structure over the samples of a single-aluminum-layer inductor structure, and inductance enhancement of about 13% in the samples of the copper-based inductor structure over the samples of the dual-aluminum-layer inductor structure over the frequency range from 10 GHz to 60 GHz. Further, samples of a dual-aluminum-layer inductor structure as manufactured by the inventors demonstrated Q factor enhancement of about 30% in the samples of the copper-based inductor structure over the samples of a single-aluminum-layer inductor structure, and Q factor enhancement of about 9% in the samples of the copper-based inductor structure over the samples of the dual-aluminum-layer inductor structure over the frequency range from 10 GHz to 60 GHz.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An organic interposer comprising:
   interconnect-level dielectric material layers embedding redistribution interconnect structures;
   at least one dielectric capping layer overlying a topmost interconnect-level dielectric material layer selected from the interconnect-level dielectric material layers;
   a bonding-level dielectric layer overlying the at least one dielectric capping layer; and
   a dual-layer inductor structure comprising:
      a lower conductive coil embedded within the topmost interconnect-level dielectric material layer;
      a conductive via structure vertically extending through the at least one dielectric capping layer and the lower conductive coil; and
      an upper conductive coil embedded within the bonding-level dielectric layer and comprising copper.

2. The organic interposer of claim 1, further comprising:
   a first bump structure overlying the bonding-level dielectric layer and contacting a top surface of a first end portion of the dual-layer inductor structure; and
   a second bump structure overlying the bonding-level dielectric layer and contacting a top surface of a second end portion of the dual-layer inductor structure.

3. The organic interposer of claim 2, wherein:
   the first bump structure comprises a first bump pillar portion overlying the bonding-level dielectric layer and a first bump via portion that extends through the bonding-level dielectric layer; and
   the second bump structure comprises a second bump pillar portion overlying the bonding-level dielectric layer and a second bump via portion that extends through the bonding-level dielectric layer.

4. The organic interposer of claim 3, the conductive via structure continuously extends laterally from an area that overlaps with the first bump via portion in a plan view to an area that overlaps with the second bump via portion in the plan view.

5. The organic interposer of claim 3, wherein:
   the first bump via portion is laterally offset from a vertical axis passing through a geometrical center of the first bump pillar portion; and
   the second bump via portion is laterally offset from a vertical axis passing through a geometrical center of the second bump pillar portion.

6. The organic interposer of claim 2, wherein:
   the upper conductive coil has a spiral configuration in which outer line segments encircle inner line segments; and
   the first bump structure has an areal overlap with multiple line segments of the upper conductive coil.

7. The organic interposer of claim 2, further comprising:
   metallic pad and via structures contacting a respective one of the redistribution interconnect structures and including a respective pad portion that is embedded within the bonding-level dielectric layer and a respective via portion that is embedded within the at least one dielectric capping layer; and
   additional bump structures contacting a respective one of the metallic pad and via structures.

8. The organic interposer of claim 7, wherein:
the pad portions of the metallic pad and via structures have a same thickness as, and have a same material composition as, the upper conductive coil; and
the additional bump structures have a same height as, and have a same material composition as, the first bump structure and the second bump structure.

9. The organic interposer of claim 1, wherein:
the conductive via structure comprises a lower portion of a spiral-shaped copper portion that underlies a horizontal plane including a top surface of the at least one dielectric capping layer; and
the upper conductive coil comprises an upper portion of the spiral-shaped copper portion that overlies the horizontal plane including the top surface of the at least one dielectric capping layer.

10. The organic interposer of claim 1, wherein:
at least 90% of a total area of the lower conductive coil has an areal overlap with the upper conductive coil in a plan view; and
at least 90% of a total area of the upper conductive coil has an areal overlap with the lower conductive coil in the plan view.

11. The organic interposer of claim 1, wherein each of the lower conductive coil, the conductive via structure, and the upper conductive coil comprises copper.

12. The organic interposer of claim 1, wherein:
the topmost interconnect-level dielectric material layer comprises a polymer material layer;
the at least one dielectric capping layer comprises at least one silicon oxide layer; and
the bonding-level dielectric layer comprises a layer stack including a silicon nitride layer and a bonding-level polymer layer.

13. A semiconductor structure, comprising:
an organic interposer, wherein the organic interposer comprises:
  interconnect-level dielectric material layers embedding redistribution interconnect structures;
  at least one dielectric capping layer overlying the interconnect-level dielectric material layers;
  a bonding-level dielectric layer overlying the at least one dielectric capping layer;
  an inductor structure that vertically extends from a topmost one of the interconnect-level dielectric material layer within the interconnect-level dielectric material layers, through the at least one dielectric capping layer, and through the bonding-level dielectric layer, comprises copper; and
  a plurality of bump structures, wherein one of the plurality of bump structures contacts a top surface of a first end portion of the inductor structure, and wherein another of the bump structures contacts a top surface of a second end portion of the inductor structure; and
a semiconductor die bonded to the organic interposer through solder material portions bonded to bump structures located on the organic interposer.

14. The semiconductor structure of claim 13, wherein the inductor structure comprises:
a lower conductive coil embedded within the topmost one of the interconnect-level dielectric material layer,
a conductive via structure vertically extending through the at least one dielectric capping layer and contacting horizontal surfaces of the lower conductive coil; and
an upper conductive coil embedded within the bonding-level dielectric layer.

15. The semiconductor structure of claim 14, wherein:
the conductive via structure comprises a lower portion of a spiral-shaped copper portion that underlies a horizontal plane including a top surface of the at least one dielectric capping layer; and
the upper conductive coil comprises an upper portion of the spiral-shaped copper portion that overlies the horizontal plane including the top surface of the at least one dielectric capping layer.

16. A method of forming an organic interposer, comprising:
forming interconnect-level dielectric material layers embedding redistribution interconnect structures and a lower conductive coil over a carrier substrate;
forming at least one dielectric capping layer over the lower conductive coil;
forming a via cavity over the lower conductive coil through the at least one dielectric capping layer;
forming a continuous conductive structure comprising copper in the via cavity and over the at least one dielectric capping layer, wherein the continuous conductive structure comprises a conductive via structure vertically extending through the at least one dielectric capping layer and contacting the lower conductive coil, and an upper conductive coil overlying the at least one dielectric capping layer, wherein a combination of the lower conductive coil, the conductive via structure, and the upper conductive coil comprises a dual-layer inductor structure; and
forming a pair of bump structures contacting end portions of the dual-layer inductor structure.

17. The method of claim 16, further comprising:
forming a bonding-level dielectric layer over the dual-layer inductor structure; and
forming bonding-level via cavities through the bonding-level dielectric layer over the end portions of the dual-layer inductor structure,
wherein the pair of bump structures comprises:
a first bump structure that includes a first bump pillar portion overlying the bonding-level dielectric layer and a first bump via portion that extends through the bonding-level dielectric layer; and
a second bump structure that includes a second bump pillar portion overlying the bonding-level dielectric layer and a second bump via portion that extends through the bonding-level dielectric layer.

18. The method of claim 17, the conductive via structure continuously extends laterally from an area that overlaps with the first bump via portion in a plan view to an area that overlaps with the second bump via portion in the plan view.

19. The method of claim 17, wherein:
the first bump via portion is laterally offset from a vertical axis passing through a geometrical center of the first bump pillar portion;
the second bump via portion is laterally offset from a vertical axis passing through a geometrical center of the second bump pillar portion;
the upper conductive coil has a spiral configuration in which outer line segments encircle inner line segments; and
the first bump structure has an areal overlap with multiple line segments of the upper conductive coil.

20. The method of claim 17, wherein:
the at least one dielectric capping layer comprises at least one of a silicon oxide layer and a silicon nitride layer;

the bonding-level dielectric layer comprises a layer stack of a dielectric passivation layer and a bonding-level polymer layer; and the continuous conductive structure includes copper at an atomic percentage greater than 90% and is free of aluminum.

\* \* \* \* \*